(12) United States Patent
Sano et al.

(10) Patent No.: US 6,646,834 B2
(45) Date of Patent: Nov. 11, 2003

(54) MAGNETIC TRANSDUCER, THIN FILM MAGNETIC HEAD, METHOD OF MANUFACTURING MAGNETIC TRANSDUCER AND METHOD OF MANUFACTURING THIN FILM MAGNETIC HEAD

(75) Inventors: Masashi Sano, Tokyo (JP); Satoru Araki, Tokyo (JP); Yoshihiro Tsuchiya, Tokyo (JP); Takumi Uesugi, Tokyo (JP)

(73) Assignee: TDK Corporation, Tokyo (JP)

( * ) Notice: Subject to any disclaimer, the term of this patent is extended or adjusted under 35 U.S.C. 154(b) by 184 days.

(21) Appl. No.: 09/904,842

(22) Filed: Jul. 16, 2001

(65) Prior Publication Data
US 2002/0030950 A1 Mar. 14, 2002

(30) Foreign Application Priority Data
Jul. 19, 2000 (JP) .................................. 2000-218322

(51) Int. Cl.[7] ................................................ G11B 5/39
(52) U.S. Cl. .................................................. 360/324.11
(58) Field of Search ........................ 360/324.1, 324.11, 360/324.12, 324.2

(56) References Cited

U.S. PATENT DOCUMENTS

| | | | | |
|---|---|---|---|---|
| 5,465,185 A | * | 11/1995 | Heim et al. | 360/324.11 |
| 5,828,529 A | | 10/1998 | Gill | 360/324.11 |
| 5,958,611 A | * | 9/1999 | Ohta et al. | 428/692 |
| 6,052,262 A | * | 4/2000 | Kamiguchi et al. | 360/324.12 |
| 6,055,135 A | * | 4/2000 | Fukamichi et al. | 360/324.12 |

FOREIGN PATENT DOCUMENTS

| | | | |
|---|---|---|---|
| JP | 8-287420 | * | 11/1996 |
| JP | 10-284321 | * | 10/1998 |
| JP | 11-74121 | * | 3/1999 |
| JP | 2000-156530 | * | 6/2000 |
| JP | 2000-216453 | * | 8/2000 |

* cited by examiner

Primary Examiner—David L. Ometz
(74) Attorney, Agent, or Firm—Oliff & Berridge PLC

(57) ABSTRACT

Provided are a magnetic transducer and a thin film magnetic head having good thermal stability and capable of obtaining a high exchange coupling magnetic field, a method of manufacturing a magnetic transducer and a method of a manufacturing a thin film magnetic head. An MR element has a stack having a stacked structure comprising an underlayer, a crystal-growth inhibitor layer, a first soft magnetic layer, a second soft magnetic layer, a nonmagnetic layer, a ferromagnetic layer, an antiferromagnetic layer and a cap layer, which are stacked in sequence. The ferromagnetic layer has an inner ferromagnetic layer, a coupling layer and an outer ferromagnetic layer, which are stacked in this order on the nonmagnetic layer. The crystal-growth inhibitor layer inhibits crystal growth of the layers formed on the crystal-growth inhibitor layer, thereby limiting an average in-surface particle diameter of the inner ferromagnetic layer to within the range of from 3 nm to 8 nm inclusive, so that an interface between the coupling layer and the inner ferromagnetic layer becomes flattened.

22 Claims, 15 Drawing Sheets

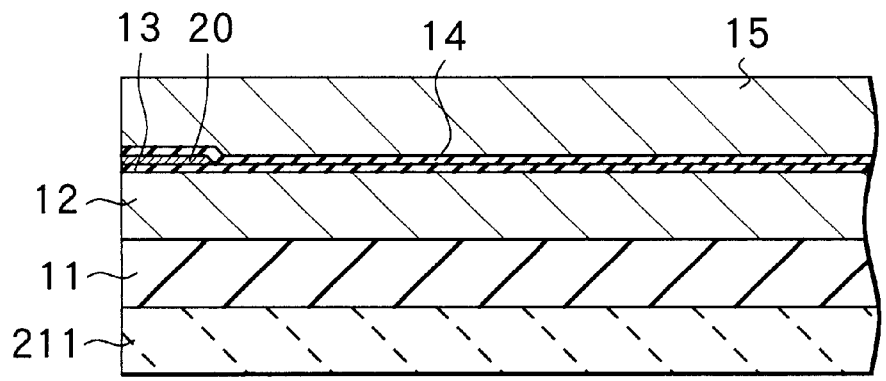
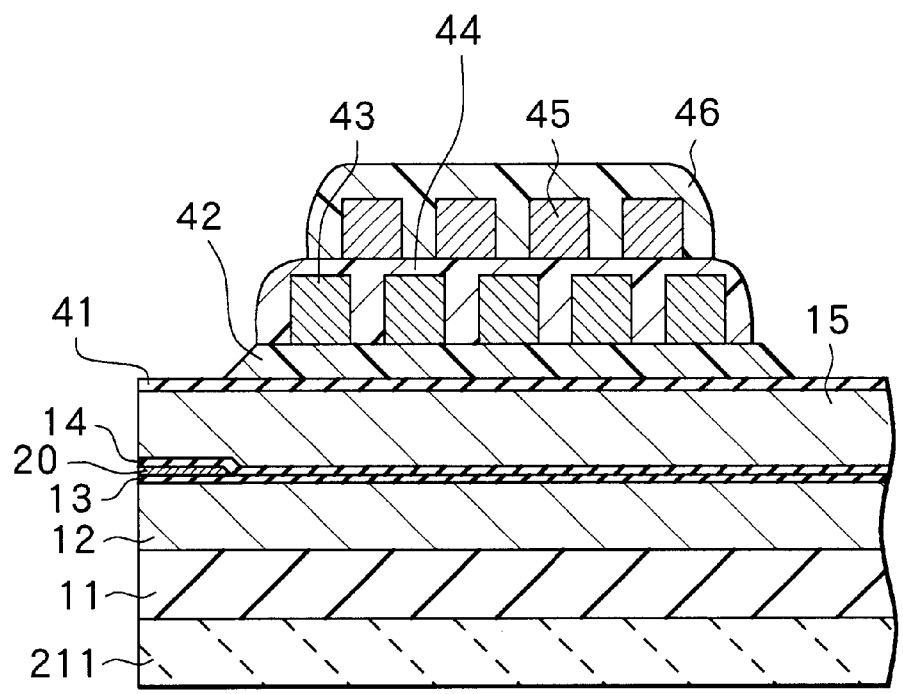

MAGNETIC TRANSDUCER, THIN FILM MAGNETIC HEAD, METHOD OF MANUFACTURING MAGNETIC TRANSDUCER AND METHOD OF MANUFACTURING THIN FILM MAGNETIC HEAD

BACKGROUND OF THE INVENTION

1. Field of the Invention

The invention relates to a magnetic transducer and a thin film magnetic head using the same. More particularly, the invention relates to a magnetic transducer capable of improving thermal stability and obtaining a high exchange coupling magnetic field, a thin film magnetic head using the same, a method of manufacturing a magnetic transducer and a method of a manufacturing a thin film magnetic head.

2. Description of the Related Art

Recently, an improvement in performance of a thin film magnetic head has been sought in accordance with an increase in a surface recording density of a hard disk or the like. A composite thin film magnetic head, which has a stacked structure comprising a reproducing head having a magnetoresistive element (hereinafter referred to as an MR element) that is a type of magnetic transducer and a recording head having an inductive magnetic transducer, is widely used as the thin film magnetic head.

MR elements include an AMR element using a magnetic film (an AMR film) exhibiting an anisotropic magnetoresistive effect (an AMR effect), a GMR element using a magnetic film (a GMR film) exhibiting a giant magnetoresistive effect (a GMR effect), and so on.

A reproducing head using the AMR element is called an AMR head, and a reproducing head using the GMR element is called a GMR head. The AMR head is used as the reproducing head having a surface recording density exceeding 1 Gbit/inch$^2$ (0.16 Gbit/cm$^2$), and the GMR head is used as the reproducing head having a surface recording density exceeding 3 Gbits/inch$^2$ (0.47 Gbit/cm$^2$).

As the GMR film, a "multilayered type (antiferromagnetic type)" film, an "inductive ferromagnetic type" film, a "granular type" film, a "spin valve type" film and the like are proposed. Of these types of films, the spin valve type GMR film is considered to have a relatively simple structure, to exhibit a great change in resistance even under a low magnetic field and to be suitable for mass production.

FIG. 19 shows a structure of a general spin valve type GMR film (hereinafter referred to as a spin valve film). A surface indicated by reference symbol S in FIG. 19 corresponds to a surface facing a magnetic recording medium. The spin valve film has a stacked structure comprising an underlayer 501, a soft magnetic layer 502, a nonmagnetic layer 503, a ferromagnetic layer 504, an antiferromagnetic layer 505 and a cap layer 506, which are stacked in this order on the underlayer 501. In the spin valve film, the orientation of magnetization Mp of the ferromagnetic layer 504 is fixed by exchange coupling between the ferromagnetic layer 504 and the antiferromagnetic layer 505, whereas the orientation of magnetization Mf of the soft magnetic layer 502 freely changes according to a signal magnetic field, and thus the resistance of the spin valve film changes according to a relative angle between the orientation of the magnetization Mp of the ferromagnetic layer 504 and the orientation of the magnetization Mf of the soft magnetic layer 502.

Currently, the size reduction of the MR element is advancing for a hard disk or the like having an extra-high recording density, but a smaller MR element results in a higher current density of a current passing through the spin valve film, and therefore, high thermal stability is required for the spin valve film.

In U.S. Pat. No. 5,828,529, disclosed is a spin valve film having the so-called synthetic pin structure comprising a coupling layer (an AF coupling film) made of ruthenium (Ru) inside a ferromagnetic layer. In U.S. Pat. No. 5,828,529, it is reported that thermal stability is improved through the adoption of the synthetic pin structure.

However, the above-mentioned U.S. Pat. No. 5,828,529 gives no report about specific improvements in thermal stability. To obtain stable resistance characteristics, it is necessary to increase an exchange coupling magnetic field to be generated between a ferromagnetic layer and an antiferromagnetic layer, but the above-mentioned U.S. Pat. No. 5,828,529 gives no report about the exchange coupling magnetic field.

SUMMARY OF THE INVENTION

The invention is designed to overcome the foregoing problems. It is an object of the invention to provide a magnetic transducer capable of improving thermal stability and obtaining a high exchange coupling magnetic field, a thin film magnetic head using the same, a method of manufacturing a magnetic transducer and a method of a manufacturing a thin film magnetic head.

A magnetic transducer of the invention comprises a stack including: a nonmagnetic layer having a pair of surfaces; a soft magnetic layer formed on one surface of the nonmagnetic layer; a ferromagnetic layer formed on the other surface of the nonmagnetic layer, the ferromagnetic layer having an inner ferromagnetic layer, a coupling layer and an outer ferromagnetic layer, which are stacked in this order on the nonmagnetic layer; and an antiferromagnetic layer formed on the ferromagnetic layer on the side opposite to the nonmagnetic layer, wherein an average crystal particle diameter of at least one of a surface, interfacing with the coupling layer, of the inner ferromagnetic layer and a surface, interfacing with the coupling layer, of the outer ferromagnetic layer lies between 3 nm and 8 nm inclusive.

Another magnetic transducer of the invention comprises a stack including: a nonmagnetic layer having a pair of surfaces; a soft magnetic layer formed on one surface of the nonmagnetic layer; a ferromagnetic layer formed on the other surface of the nonmagnetic layer, the ferromagnetic layer having an inner ferromagnetic layer, a coupling layer and an outer ferromagnetic layer, which are stacked in this order on the nonmagnetic layer; and an antiferromagnetic layer formed on the ferromagnetic layer on the side opposite to the nonmagnetic layer, wherein at least one of the inner ferromagnetic layer and the outer ferromagnetic layer has an average crystal particle diameter of from 3 nm to 8 nm inclusive in a direction perpendicular to a stacking direction of the stack.

In a magnetic transducer or another magnetic transducer of the invention, the average crystal particle diameter of at least one of the inner ferromagnetic layer and the outer ferromagnetic layer lies between 3 nm and 8 nm inclusive, so that the interface between the coupling layer and at least one of the inner and outer ferromagnetic layers becomes flattened, and therefore the thermal stability improves, and the exchange coupling magnetic field increases.

Preferably, the stack includes a crystal-growth inhibitor layer, which is located at least one of on a side close to the antiferromagnetic layer and on a side close to the soft magnetic layer with respect to the coupling layer and is made of a material containing at least one element in a group consisting of O (oxygen), N (nitrogen), H (hydrogen), Cu (copper), Au (gold), Ag (silver) and Rh (rhodium). More preferably, the crystal-growth inhibitor layer is dispersedly formed in the direction perpendicular to the stacking direction of the stack. Preferably, the inner ferromagnetic layer and the outer ferromagnetic layer are made of a material containing at least Co in a group consisting of Co (cobalt) and Fe (iron). Preferably, the coupling layer is made of a material containing at least one element in a group consisting of Ru (ruthenium), Rh, Re (rhenium) and Cr (chromium).

A thin film magnetic head of the invention comprises: a stack including a nonmagnetic layer having a pair of surfaces, a soft magnetic layer formed on one surface of the nonmagnetic layer, a ferromagnetic layer formed on the other surface of the nonmagnetic layer, and an antiferromagnetic layer formed on the ferromagnetic layer on the side opposite to the nonmagnetic layer; and a base for supporting the stack, wherein the ferromagnetic layer has an inner ferromagnetic layer, a coupling layer and an outer ferromagnetic layer, which are stacked in this order on the nonmagnetic layer, and an average crystal particle diameter of a surface or surfaces, interfacing with the coupling layer, of at least one of the inner ferromagnetic layer and the outer ferromagnetic layer, which is closer to the base lies between 3 nm and 8 nm inclusive.

Another thin film magnetic head of the invention comprises: a stack including a nonmagnetic layer having a pair of surfaces, a soft magnetic layer formed on one surface of the nonmagnetic layer, a ferromagnetic layer formed on the other surface of the nonmagnetic layer, and an antiferromagnetic layer formed on the ferromagnetic layer on the side opposite to the nonmagnetic layer; and a base for supporting the stack, wherein the ferromagnetic layer has an inner ferromagnetic layer, a coupling layer and an outer ferromagnetic layer, which are stacked in this order on the nonmagnetic layer, and at least one of the inner ferromagnetic layer and the outer ferromagnetic layer, which is located closer to the base, has an average crystal particle diameter of from 3 nm to 8 nm inclusive in a direction perpendicular to a stacking direction of the stack.

In a thin film magnetic head or another thin film magnetic head of the invention, the average crystal particle diameter of at least one of the inner ferromagnetic layer and the outer ferromagnetic layer, which is located closer to the base, lies between 3 nm and 8 nm inclusive, so that the interfaces between the coupling layer and the inner and outer ferromagnetic layers improve in flatness. That is, the thermal stability further improves, and the exchange coupling magnetic field further increases.

Preferably, the stack includes a crystal-growth inhibitor layer, which is located on the side closer to the base with respect to the coupling layer and is made of a material containing at least one element in a group consisting of O, N, H, Cu, Au, Ag and Rh. Preferably, the crystal-growth inhibitor layer is dispersedly formed in the direction perpendicular to the stacking direction of the stack.

A method of manufacturing a magnetic transducer of the invention comprising a stack including: a nonmagnetic layer having a pair of surfaces; a soft magnetic layer formed on one surface of the nonmagnetic layer; a ferromagnetic layer formed on the other surface of the nonmagnetic layer, the ferromagnetic layer having an inner ferromagnetic layer, a coupling layer and an outer ferromagnetic layer, which are stacked in this order on the nonmagnetic layer; and an antiferromagnetic layer formed on the ferromagnetic layer on the side opposite to the nonmagnetic layer includes the step of forming a crystal-growth inhibitor layer dispersed in a direction perpendicular to a stacking direction of the stack, on one side or both sides of the coupling layer.

A method of manufacturing a thin film magnetic head of the invention comprising: a magnetic transducer comprising a stack including a nonmagnetic layer having a pair of surfaces, a soft magnetic layer formed on one surface of the nonmagnetic layer, a ferromagnetic layer formed on the other surface of the nonmagnetic layer, the ferromagnetic layer having an inner ferromagnetic layer, a coupling layer and an outer ferromagnetic layer, which are stacked in this order on the nonmagnetic layer, and an antiferromagnetic layer formed on the ferromagnetic layer on the side opposite to the nonmagnetic layer; and a base for supporting the stack includes the step of forming a crystal-growth inhibitor layer dispersed in a direction perpendicular to a stacking direction of the stack, in a portion of the stack closer to at least the base with respect to the coupling layer.

According to the method of manufacturing a magnetic transducer or the method of manufacturing a thin film magnetic head of the invention, the crystal-growth inhibitor layer inhibits crystal growth of at least one of the inner ferromagnetic layer and the outer ferromagnetic layer, thereby improving the flatness of the interface between the coupling layer and at least one of the inner and outer ferromagnetic layers. Therefore, the magnetic transducer or the thin film magnetic head having good thermal stability and a high exchange coupling magnetic field can be obtained.

Preferably, the crystal-growth inhibitor layer is formed of a material containing at least one element in a group consisting of O, N, H, Cu, Au, Ag and Rh. Preferably, the step of forming the crystal-growth inhibitor layer includes the step of exposing a portion of the stack on which the crystal-growth inhibitor layer is to be formed, to an atmosphere containing at least one element in a group consisting of O, N and H. Preferably, the step of forming the crystal-growth inhibitor layer is executed by use of vacuum deposition.

Other and further objects, features and advantages of the invention will appear more fully from the following description.

BRIEF DESCRIPTION OF THE DRAWINGS

FIGS. 12A and 12B are sectional views for describing a step following the step shown in FIGS. 11A and 11B;

DETAILED DESCRIPTION OF THE PREFERRED EMBODIMENTS

[First Embodiment]

<Configurations of MR Element and Thin Film Magnetic Head>

Firstly, the description is given with reference to FIGS. 1 to 7 with regard to the respective configurations of an MR element that is a specific example of a magnetic transducer according to a first embodiment of the invention and a thin film magnetic head using the MR element.

Figure 1:
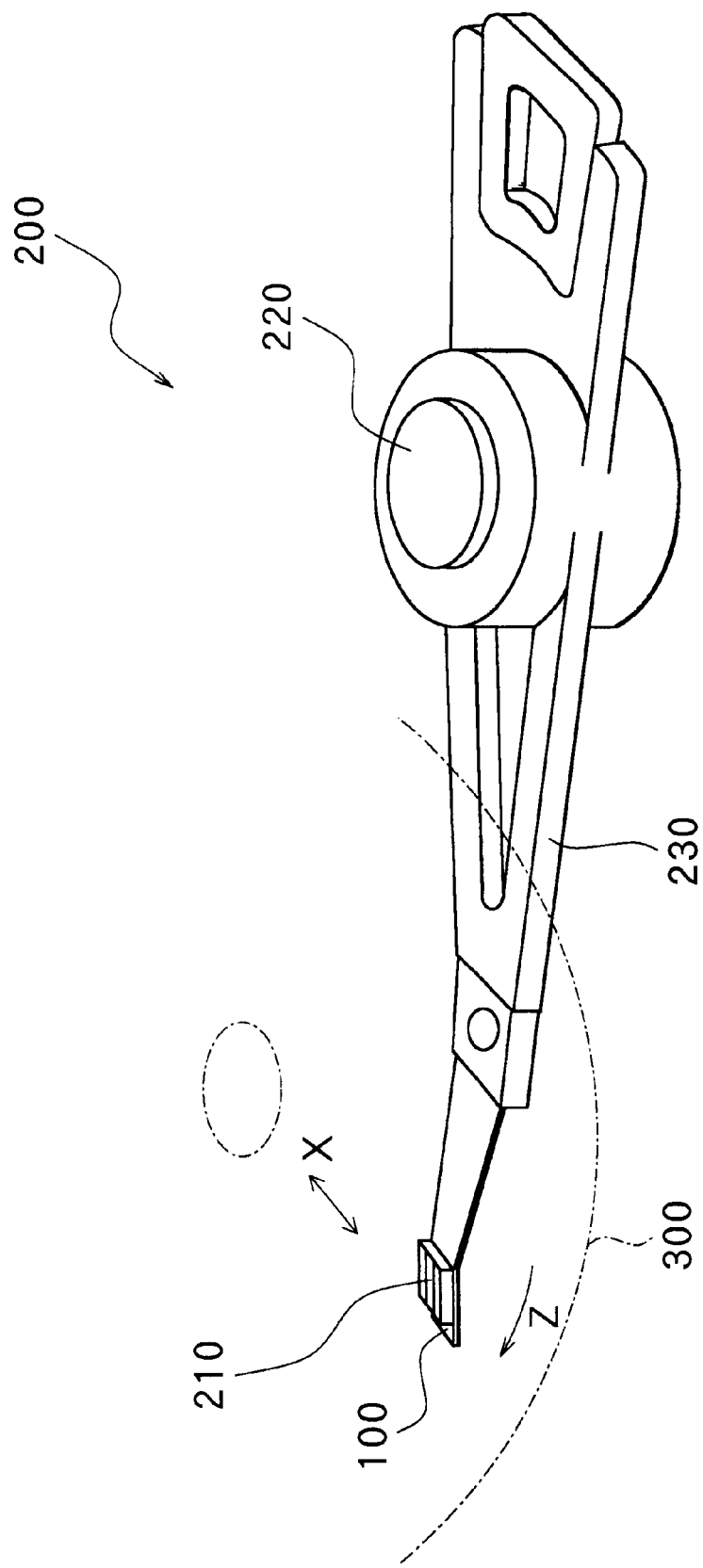
FIG. 1 is a perspective view of a configuration of an actuator arm comprising a thin film magnetic head including a magnetic transducer according to a first embodiment of the invention.

FIG. 1 shows a configuration of an actuator arm 200 comprising a thin film magnetic head 100 according to the embodiment. The actuator arm 200 is used in, for example, a hard disk drive (not shown) or the like and has a slider 210 on which the thin film magnetic head 100 is formed. For instance, the slider 210 is mounted on the tip of an arm 230 rotatably supported by a pivot 220. For example, the arm 230 is rotated by a driving force of a voice coil motor (not shown), and thus the slider 210 moves in a direction x in which the slider 210 crosses a track line along a recording surface of a magnetic recording medium 300 such as a hard disk (a lower surface of the recording surface in FIG. 1). For instance, the magnetic recording medium 300 rotates in a direction z substantially perpendicular to the direction x in which the slider 210 crosses the track line. The magnetic recording medium 300 rotates and the slider 210 moves as mentioned above, whereby information is recorded on the magnetic recording medium 300 or recorded information is read out from the magnetic recording medium 300.

Figure 2:
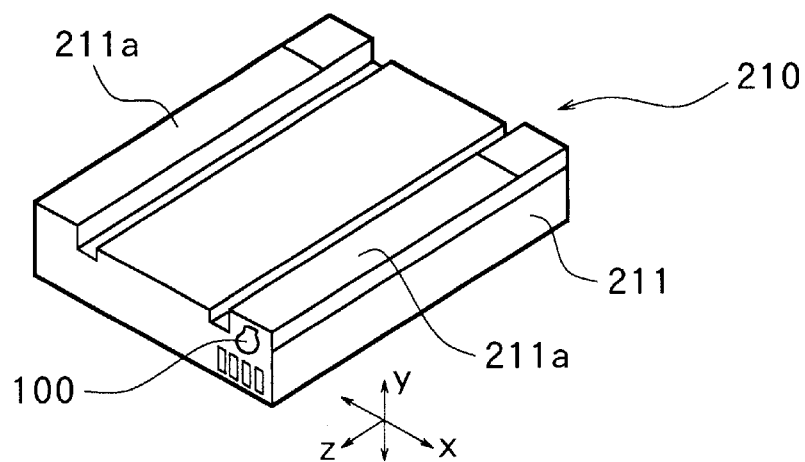
FIG. 2 is a perspective view of a configuration of a slider of the actuator arm shown in FIG. 1.

FIG. 2 shows a configuration of the slider 210 shown in FIG. 1. The slider 210 has a block-shaped base 211 made of $Al_2O_3$—TiC (altic), for example. The base 211 is, for instance, substantially hexahedral in shape, and one face of this hexahedron closely faces the recording surface of the magnetic recording medium 300 (see FIG. 1). A surface facing the recording surface of the magnetic recording medium 300 is called an air bearing surface (ABS) 211a. When the magnetic recording medium 300 rotates, airflow generated between the recording surface of the magnetic recording medium 300 and the air bearing surface 211a causes the slider 210 to slightly move away from the recording surface in a direction y opposite to the recording surface, and thus a uniform clearance is created between the air bearing surface 211a and the magnetic recording medium 300. The thin film magnetic head 100 is provided on one side (the left side in FIG. 2) faced with the air bearing surface 211a of the base 211.

Figure 3:
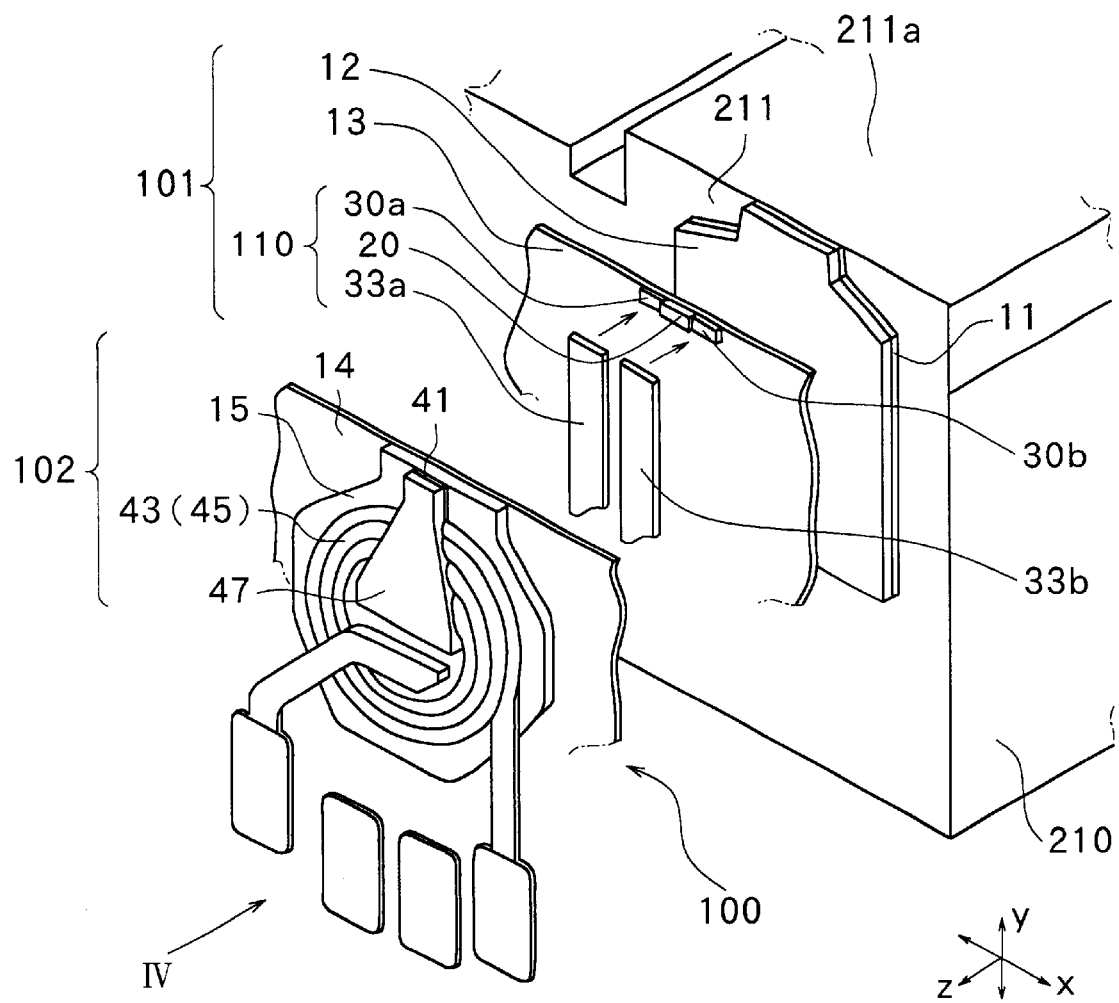
FIG. 3 is an exploded perspective view of a configuration of the thin film magnetic head according to the first embodiment.
Figure 4:
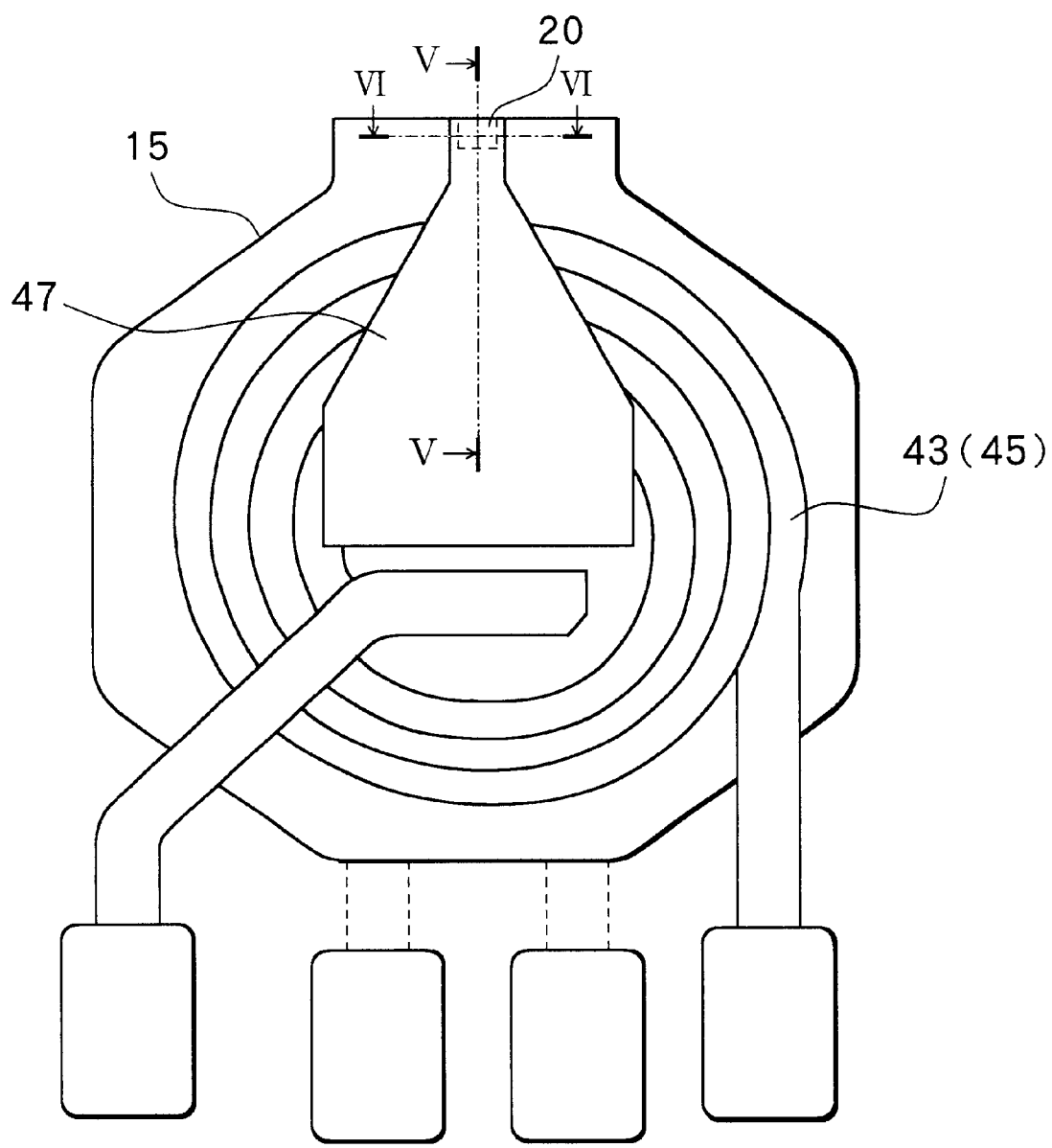
FIG. 4 is a plan view of the thin film magnetic head shown in FIG. 3, showing the structure thereof viewed in the direction of the arrow IV of FIG. 3.
Figure 5:
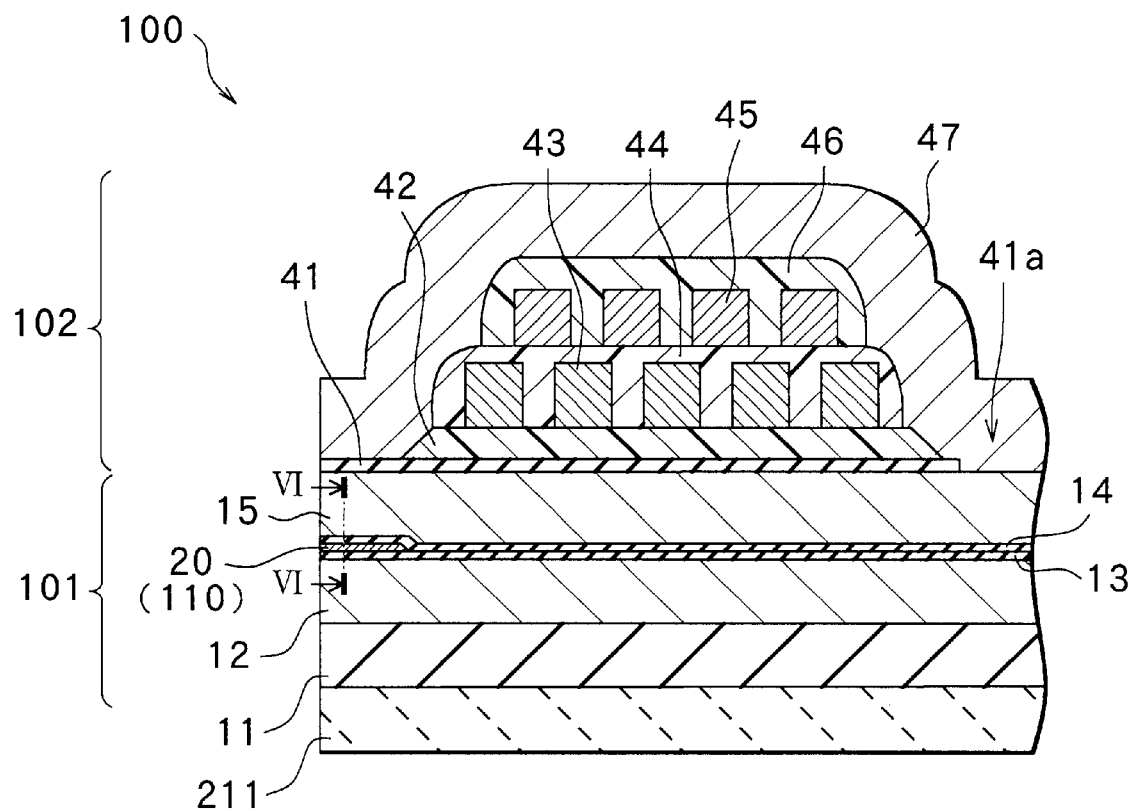
FIG. 5 is a sectional view of the thin film magnetic head shown in FIG. 3, showing the structure thereof viewed in the direction of the arrows along the line V—V of FIG. 4.
Figure 6:
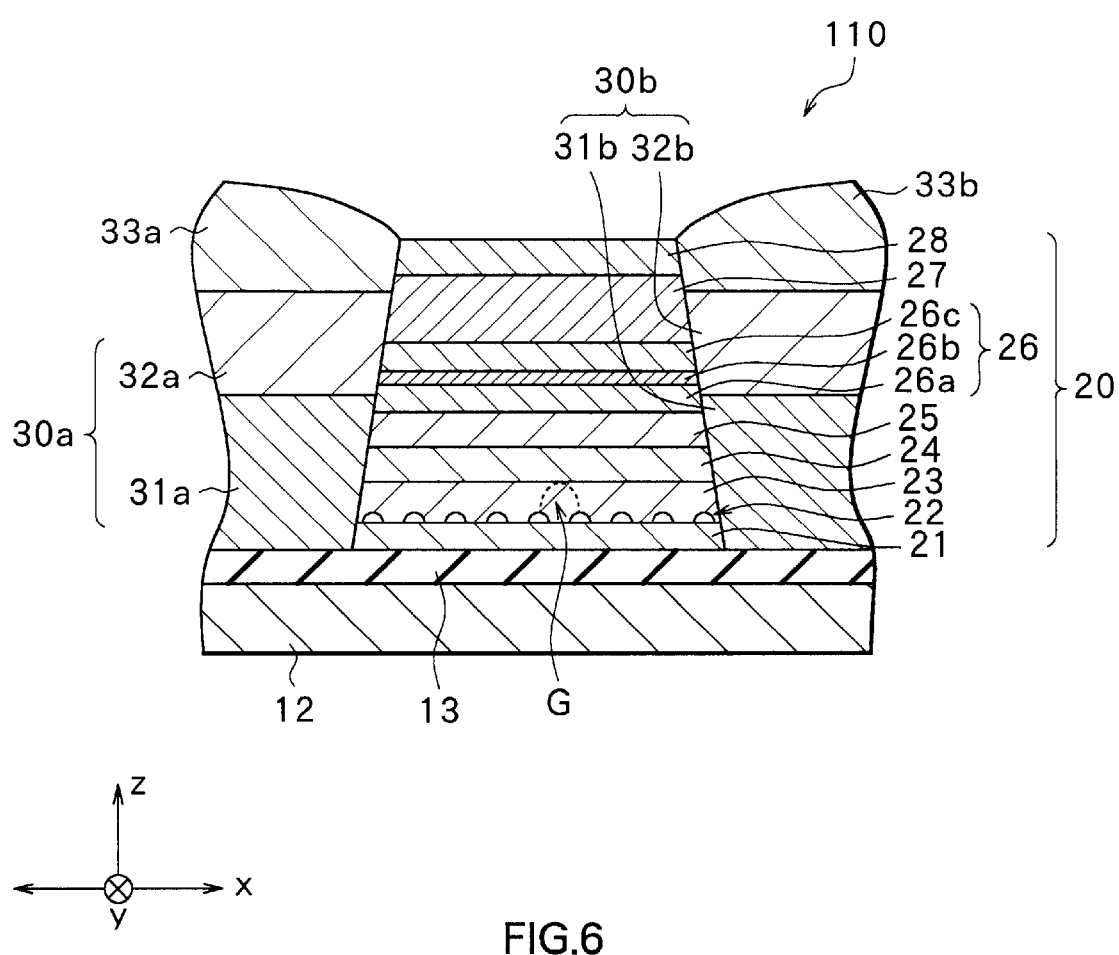
FIG. 6 is a sectional view of the thin film magnetic head shown in FIG. 3, showing the structure thereof viewed in the direction of the arrows along the line VI—VI of FIG. 4, i.e., the structure thereof viewed in the direction of the arrows along the line VI—VI of FIG. 5.
Figure 7:
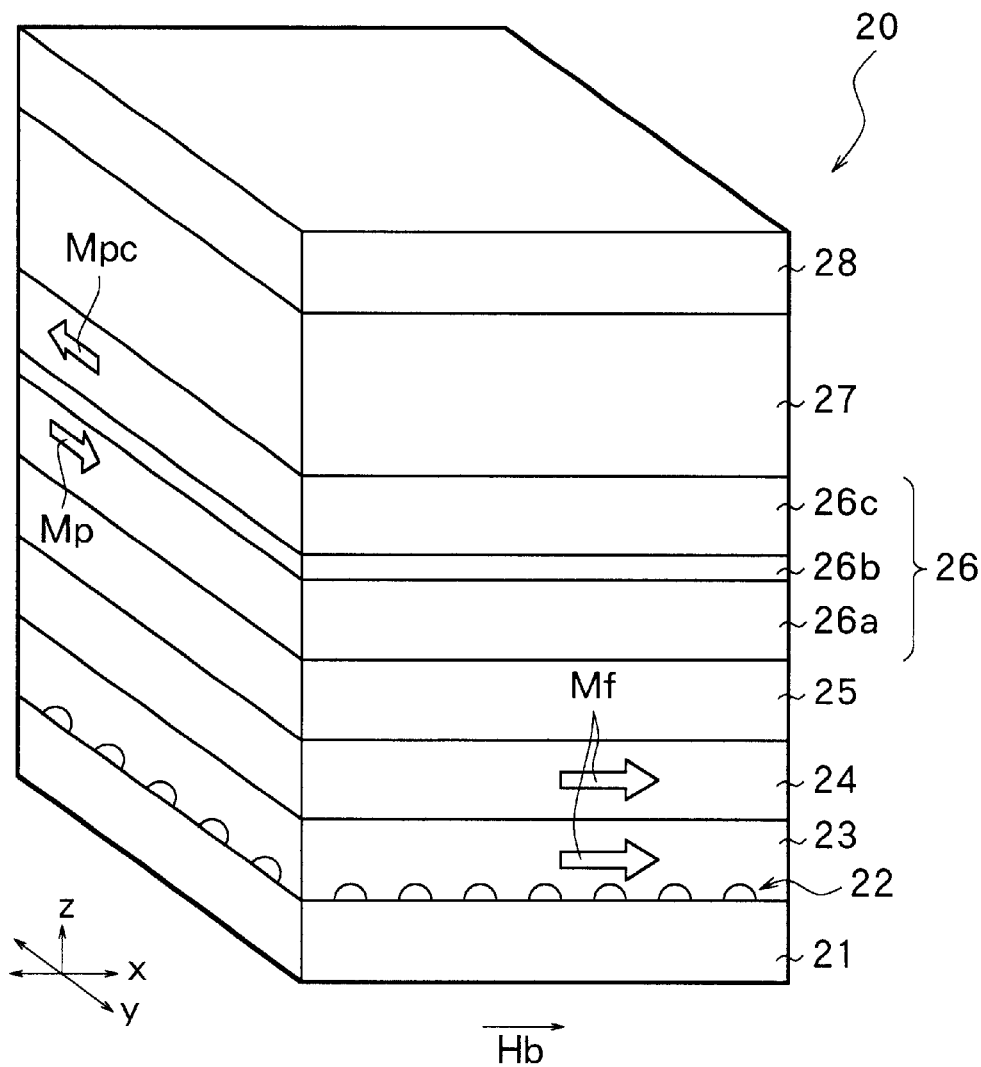
FIG. 7 is a perspective view of a configuration of a stack of the magnetic transducer shown in FIG. 6.

FIG. 3 is an exploded view of a configuration of the thin film magnetic head 100. FIG. 4 shows a planar structure viewed in the direction of the arrow IV of FIG. 3. FIG. 5 shows a sectional structure viewed in the direction of the arrows along the line V—V of FIG. 4. FIG. 6 shows a sectional structure viewed in the direction of the arrows along the line VI—VI of FIG. 4, i.e., the direction of the arrows along the line VI—VI of FIG. 5. FIG. 7 shows a part of the structure shown in FIG. 6. The thin film magnetic head 100 has an integrated structure comprising a reproducing head 101 for reproducing magnetic information recorded on the magnetic recording medium 300 and a recording head 102 for recording magnetic information on the track line of the magnetic recording medium 300.

As shown in FIGS. 3 and 5, for example, the reproducing head 101 has a stacked structure comprising an insulating layer 11, a bottom shield layer 12, a bottom shield gap layer 13, a top shield gap layer 14 and a top shield layer 15, which are stacked in this order on the base 211 when viewed from the side of the air bearing surface 211a. For example, the insulating layer 11 is 2 μm to 10 μm in thickness along a stacking direction (hereinafter referred to as a thickness) and is made of $Al_2O_3$ (aluminum oxide). For example, the bottom shield layer 12 is 1 μm to 3 μm in thickness and is made of a magnetic material such as NiFe (a nickel-iron alloy). For example, the bottom shield gap layer 13 and the top shield gap layer 14 are each 10 nm to 100 nm in thickness and are made of $Al_2O_3$ or AlN (aluminum nitride). For example, the top shield layer 15 is 1 μm to 4 μm in thickness and is made of a magnetic material such as NiFe. The top shield layer 15 also functions as a bottom pole for the recording head 102.

An MR element 110 including a stack 20 that is a spin valve film is sandwiched in between the bottom shield gap layer 13 and the top shield gap layer 14. The reproducing head 101 is adapted to read out information recorded on the magnetic recording medium 300 through the use of the electrical resistance of the stack 20 changing according to a signal magnetic field from the magnetic recording medium 300.

For example, as shown in FIGS. 6 and 7, the stack 20 has a stacked structure comprising an underlayer 21, a crystal-growth inhibitor layer 22, a first soft magnetic layer 23, a second soft magnetic layer 24, a nonmagnetic layer 25, a ferromagnetic layer 26, an antiferromagnetic layer 27 and a cap layer 28, which are stacked in this order on the bottom shield gap layer 13. The ferromagnetic layer 26 has an inner ferromagnetic layer 26a, a coupling layer 26b and an outer ferromagnetic layer 26c, which are stacked in this order on the nonmagnetic layer 25. For example, the underlayer 21 is 5 nm in thickness and is made of Ta.

The crystal-growth inhibitor layer 22 serves to inhibit crystal growth of the layers formed on the crystal-growth inhibitor layer 22 so as to improve flatness of the respective interfaces between the coupling layer 26b and the inner and outer ferromagnetic layers 26a and 26c of the ferromagnetic layer 26. In the embodiment, the crystal-growth inhibitor layer 22 is formed between the underlayer 21 and the first soft magnetic layer 23, but the crystal-growth inhibitor layer 22 can be provided at a position closer to the base 211 with respect to the coupling layer 26b of the stack 20, that is, at such a position that the crystal-growth inhibitor layer 22 is formed earlier than the coupling layer 26b in the process of stacking the layers of the stack 20. Thus, the inner ferromagnetic layer 26a, the coupling layer 26b and the outer ferromagnetic layer 26c are formed above the crystal-growth inhibitor layer 22, so that the crystal growth of these layers 26a, 26b and 26c can be entirely inhibited, and therefore the interfaces between the coupling layer 26b and the inner and outer ferromagnetic layers 26a and 26c can be made flatter. When the crystal-growth inhibitor layer 22 is provided between the underlayer 21 and the first soft magnetic layer 23, an adverse influence of the existence of an impurity upon head characteristics can be reduced. In the embodiment, "the position closer to the base 211 with respect to the coupling layer 26b" refers to a position closer to the first soft magnetic layer 23 with respect to the coupling layer 26b in the stack 20.

The crystal-growth inhibitor layer 22 is made of, for example, a material containing at least one element in a group consisting of O, N, H, Cu, Au, Ag and Rh, and preferably, the crystal-growth inhibitor layer 22 is dispersedly formed in a surface perpendicular to the stacking direction of the stack 20. Thus, as indicated by reference symbol G in FIG. 6, a crystal grows in a gap between the neighboring crystal-growth inhibitor layers 22 dispersedly formed, so that the crystal growth is surely inhibited. In this manner, the crystal-growth inhibitor layer 22 inhibits the crystal growth of the layers formed on the crystal-growth inhibitor layer 22 so that an average in-surface crystal particle diameter of at least the inner ferromagnetic layer 26a lies between 3 nm and 8 nm inclusive. Herein, "the average in-surface crystal particle diameter" refers to an average value of crystal particle diameters in the surface perpendicular to the stacking direction of the stack 20, and is measured through observation using a TEM (a transmission electron microscope) or the like. A thickness of the crystal-growth inhibitor layer 22 is about 1 nm, for example.

For instance, the first soft magnetic layer 23 is 1 nm to 3 nm in thickness and is made of a magnetic material containing at least Ni in a group consisting of Ni, Co, Fe, Ta (tantalum), Cr, Rh, Mo (molybdenum) and Nb (niobium). Specifically, it is preferable that the first soft magnetic layer 23 be made of $[Ni_xCo_yFe_{100-(x+y)}]_{100-z}M_{Iz}$, where $M_I$ represents at least one of Ta, Cr, Rh, Mo and Nb, and x, y and z are within the respective ranges of $75 \leq x \leq 90$, $0 \leq y \leq 15$ and $0 \leq z \leq 15$ in units of atom %.

For example, the second soft magnetic layer 24 is 0.5 nm to 3 nm in thickness and is made of a magnetic material containing at least Co in a group consisting of Ni, Co and Fe. Specifically, it is preferable that the second soft magnetic layer 24 be made of $Co_xFe_yNi_{100-(x+y)}$ having the (111) plane oriented in the stacking direction, where x and y are within the respective ranges of $70 \leq x \leq 100$ and $0 \leq y \leq 25$ in units of atom %.

Both the first soft magnetic layer 23 and the second soft magnetic layer 24 constitute a soft magnetic layer which is sometimes called a free layer, and the orientation of a magnetic field of the soft magnetic layer changes according to a signal magnetic field from the magnetic recording medium 300. Preferably, a thickness of the soft magnetic layer, i.e., the sum of the thicknesses of the first soft magnetic layer 23 and the second soft magnetic layer 24, is 2 nm to 10 nm, for example.

For example, the nonmagnetic layer 25 is 1.8 nm to 3 nm in thickness and is made of a nonmagnetic material containing at least one element in a group consisting of Au, Ag, Cu, Ru, Rh, Re, Pt (platinum) and W (tungsten), and the percentage of content of the at least one element is 80 wt % or more. The nonmagnetic layer 25 serves to magnetically isolate the soft magnetic layer (i.e., the first soft magnetic layer 23 and the second soft magnetic layer 24) from the ferromagnetic layer 26 and the antiferromagnetic layer 27 as much as possible.

The ferromagnetic layer 26 is sometimes called a pinned layer, and the orientation of magnetization thereof is fixed by exchange coupling on an interface between the ferromagnetic layer 26 and the antiferromagnetic layer 27. Both the inner ferromagnetic layer 26a and the outer ferromagnetic layer 26c of the ferromagnetic layer 26 are made of a magnetic material containing at least Co in a group consisting of Co and Fe, and desirably, the (111) plane of the magnetic material is oriented in the stacking direction. A thickness of the inner ferromagnetic layer 26a is, for example, 1 nm to 4 nm, and a thickness of the outer ferromagnetic layer 26c is, for example, 1 nm to 4 nm.

For example, the coupling layer 26b interposed between the inner ferromagnetic layer 26a and the outer ferromagnetic layer 26c is 0.2 nm to 1.2 nm in thickness and is made of a nonmagnetic material containing at least one element in a group consisting of Ru, Rh, Re and Cr. The coupling layer 26b serves to induce antiferromagnetic exchange coupling between the inner ferromagnetic layer 26a and the outer ferromagnetic layer 26c so as to orient magnetization Mp of the inner ferromagnetic layer 26a and magnetization Mpc of the outer ferromagnetic layer 26c in opposite directions. Herein, the phrase "magnetizations are oriented in opposite directions" means not only that the orientation of one magnetization differs by 180 degrees from the orientation of the other magnetization, but also that a relative angle between the orientations of two magnetizations is more than 90 degrees.

In the embodiment, the orientation of the magnetization Mpc of the outer ferromagnetic layer 26c is fixed in, for example, the y-direction by exchange coupling on an interface between the outer ferromagnetic layer 26c and the antiferromagnetic layer 27. The orientation of the magnetization Mp of the inner ferromagnetic layer 26a is fixed in the direction opposite to the magnetization Mpc of the outer ferromagnetic layer 26c by antiferromagnetic exchange coupling between the inner ferromagnetic layer 26a and the outer ferromagnetic layer 26c with the coupling layer 26b in between. In the stack 20, an influence of a magnetic field generated by the ferromagnetic layer 26 upon the first soft magnetic layer 23 and the second soft magnetic layer 24 can be therefore reduced.

In the inner ferromagnetic layer 26a, the average in-surface crystal particle diameter is limited to within the range of from 3 nm to 8 nm inclusive. The crystal particle diameter of the inner ferromagnetic layer 26a is limited so as to flatten the interface between the inner ferromagnetic layer 26a and the coupling layer 26b, thereby improving thermal stability and increasing an exchange coupling magnetic field. Preferably, the average in-surface crystal particle diameter of the interface of the inner ferromagnetic layer 26a with the coupling layer 26b (i.e., the interface with the coupling layer) is limited to within the range of from 3 nm to 8 nm inclusive. When the average in-surface crystal particle diameter of the inner ferromagnetic layer 26a is more than 8 nm, little effect of improving the thermal stability, the exchange coupling magnetic field and the like is achieved. When the average in-surface crystal particle diameter is less than 3 nm, there is a problem that a magnetoresistive effect (i.e., properties of resistance changing according to a change in a signal magnetic field) deteriorates. Incidentally, the average in-surface crystal particle diameters of the coupling layer 26b and the outer ferromagnetic layer 26c do not have to be limited to within the range from 3 nm to 8 nm inclusive.

Preferably, the average in-surface crystal particle diameter of at least one of layers below the inner ferromagnetic layer 26a (i.e., closer to the base 211) lies between 3 nm and 8 nm inclusive in order that the average in-surface crystal particle diameter of the inner ferromagnetic layer 26a may lie between 3 nm and 8 nm inclusive. When the average in-surface crystal particle diameter of a given layer lies between 3 nm and 8 nm inclusive, the crystal growth of the layers formed on the given layer is also inhibited. The crystal-growth inhibitor layer 22 is provided on the underlayer 21 as mentioned above so that the average in-surface crystal particle diameters of all of the first soft magnetic layer 23, the second soft magnetic layer 24, the nonmagnetic layer 25 and the inner ferromagnetic layer 26a lie between 3 nm and 8 nm inclusive.

For example, the antiferromagnetic layer 27 is 5 nm to 30 nm in thickness and is made of an antiferromagnetic material containing at least one element $M_{II}$ in a group consisting of Pt, Ru, Rh, Pd (palladium), Ni, Au, Ag, Cu, Ir (iridium), Cr and Fe, and Mn. Preferably, the percentage of content of Mn is from 45 atom % to 95 atom % inclusive, and the percentage of content of the other element $M_{II}$ is from 5 atom % to 65 atom % inclusive. Antiferromagnetic materials include a non-heat-treatment type antiferromagnetic material which exhibits antiferromagnetism without heat treatment and induces an exchange coupling magnetic field between the antiferromagnetic material and a ferromagnetic material, and a heat-treatment type antiferromagnetic material which exhibits antiferromagnetism with heat treatment. The antiferromagnetic layer 27 may be made of either the non-heat-treatment type antiferromagnetic material or the heat-treatment type antiferromagnetic material.

Non-heat-treatment type antiferromagnetic materials include a Mn alloy having γ-phase, and so on. Specifically, RuRhMn (a ruthenium-rhodium-manganese alloy), FeMn (an iron-manganese alloy), IrMn (an iridium-manganese alloy) and the like are included. Heat-treatment type antiferromagnetic materials include a Mn alloy having a regular crystal structure, and so forth. Specifically, PtMn (a platinum-manganese alloy), NiMn (a nickel-manganese alloy), PtRhMn (a platinum-rhodium-manganese alloy) and the like are included.

Magnetic domain control films 30a and 30b are provided on both sides of the stack 20, i.e., both sides in the direction perpendicular to the stacking direction, thereby matching the orientations of magnetizations of the first soft magnetic layer 23 and the second soft magnetic layer 24 to each other, thus forming a single magnetic domain and thus preventing the so-called Barkhausen noise. The magnetic domain control film 30a has a stacked structure comprising a magnetic domain controlling ferromagnetic film 31a and a magnetic domain controlling antiferromagnetic film 32a, which are stacked in this order on the bottom shield gap layer 13. The magnetic domain control film 30b has the same structure as the magnetic domain control film 30a has. The orientations of magnetizations of the magnetic domain controlling ferromagnetic films 31a and 31b are fixed by exchange coupling on the interfaces between the magnetic domain controlling ferromagnetic films 31a and 31b and the magnetic domain controlling antiferromagnetic films 32a and 32b. Thus, a bias magnetic field Hb to the first soft magnetic layer 23 and the second soft magnetic layer 24 is generated in the x-direction near the magnetic domain controlling ferromagnetic films 31a and 31b, as shown in FIG. 7, for example.

For example, the magnetic domain controlling ferromagnetic films 31a and 31b are each 10 nm to 50 nm in thickness. For example, the magnetic domain controlling ferromagnetic films 31a and 31b are made of a magnetic material made of NiFe or of Ni, Fe and Co, or the like. The magnetic domain controlling ferromagnetic films 31a and 31b may be each made of a stacked film of a NiFe film and a Co film. For example, the magnetic domain controlling antiferromagnetic films 32a and 32b are each 5 nm to 30 nm in thickness and are made of an antiferromagnetic material. Although the antiferromagnetic material may be either the non-heat-treatment type antiferromagnetic material or the heat-treatment type antiferromagnetic material, the non-heat-treatment type antiferromagnetic material is preferable.

Lead layers 33a and 33b, which are each made of a stacked film of Ta and Au, a stacked film of TiW and Ta, a stacked film of TiN (titanium anitride) and Ta, or the like, are provided on the magnetic domain control films 30a and 30b, respectively, so that a current can pass through the stack 20 via the magnetic domain control films 30a and 30b.

For example, as shown in FIGS. 3 and 5, the recording head 102 has a write gap layer 41 of 0.1 µm to 0.5 µm thick made of an insulating film such as $Al_2O_3$ on the top shield layer 15. The write gap layer 41 has an opening 41a at a position corresponding to the center of thin film coils 43 and 45 to be described later. The thin film coil 43 of 1 µm to 3 µm thick and a photoresist layer 44 for coating the thin film coil 43 are formed on the write gap layer 41 with a photoresist layer 42 in between, and the photoresist layer 42 has a thickness of 1.0 µm to 5.0 µm for determining a throat height. The thin film coil 45 of 1 µm to 3 µm thick and a photoresist layer 46 for coating the thin film coil 45 are formed on the photoresist layer 44. In the embodiment, the description is given with regard to an example in which two thin film coil layers are stacked, but the number of thin film coil layers may be one, or three or more.

A top pole 47 of about 3 µm thick made of a magnetic material having a high saturation magnetic flux density, such as NiFe or FeN (iron nitride), is formed on the write gap layer 41 and the photoresist layers 42, 44 and 46. The top pole 47 is in contact with and magnetically coupled to the top shield layer 15 through the opening 41a of the write gap layer 41 located at the position corresponding to the center of the thin film coils 43 and 45. Although not shown in FIGS. 3 to 6, an overcoat layer (an overcoat layer 48 shown in FIG. 13B) of 20 µm to 30 µm thick made of, for example, $Al_2O_3$ is formed on the top pole 47 so as to coat the overall surface. Thus, the recording head 102 generates a magnetic flux between the top shield layer 15 for functioning as the bottom pole and the top pole 47 by means of a current passing through the thin film coils 43 and 45, and thus magnetizes the magnetic recording medium 300 by means of the magnetic flux generated near the write gap layer 41, thereby recording information on the magnetic recording medium 300.

<Operation of MR Element and Thin Film Magnetic Head>

Next, a reproducing operation of the MR element 110 and the thin film magnetic head 100 configured as described above will be described with main reference to FIGS. 6 and 7.

In the thin film magnetic head 100, the reproducing head 101 reads out information recorded on the magnetic recording medium 300. In the reproducing head 101, for example, the orientation of the magnetization Mpc of the outer ferromagnetic layer 26c is fixed in the y-direction by exchange coupling on the interface between the outer ferromagnetic layer 26c of the ferromagnetic layer 26 and the antiferromagnetic layer 27. The orientation of the magnetization Mp of the inner ferromagnetic layer 26a is fixed in the direction opposite to the magnetization Mpc by antiferromagnetic exchange coupling between the inner ferromagnetic layer 26a and the outer ferromagnetic layer 26c with the coupling layer 26b in between. Magnetizations Mf of the first soft magnetic layer 23 and the second soft magnetic layer 24 are oriented in the direction of the bias magnetic field Hb (the x-direction in the embodiment) by the bias magnetic field Hb generated by the magnetic domain control films 30a and 30b. The orientation of the bias magnetic field Hb is substantially perpendicular to the orientations of the magnetizations Mp and Mpc of the ferromagnetic layer 26.

To read out information, a sense current that is a stationary electric current is fed through the stack 20 through the lead layers 33a and 33b in the direction of the bias magnetic field Hb, for example. The current mainly passes through the ferromagnetic layer 26, the nonmagnetic layer 25, the second soft magnetic layer 24 and the first soft magnetic layer 23, because the antiferromagnetic layer 27 has a higher electrical resistance than the other layers of the stack 20 have.

The orientations of the magnetizations Mf of the first soft magnetic layer 23 and the second soft magnetic layer 24 change when these layers are subjected to a signal magnetic field from the magnetic recording medium 300. The orientations of the magnetizations Mp and Mpc of the ferromagnetic layer 26 do not change even under the signal magnetic field from the magnetic recording medium 300, because the orientations are fixed by the antiferromagnetic layer 27. When the orientations of the magnetizations Mf of the first soft magnetic layer 23 and the second soft magnetic layer 24 change, the current passing through the stack 20 is subjected to resistance according to a relative angle between the orientations of the magnetizations Mf of the first soft magnetic layer 23 and the second soft magnetic layer 24 and the orientations of the magnetizations Mp and Mpc of the ferromagnetic layer 26. This results from a phenomenon which is called "spin-dependent scattering" that the degree of scattering of electrons on an interface between a nonmagnetic layer and a magnetic layer depends on the direction of magnetization of the magnetic layer. The magnitude of change in resistance of the stack 20 is detected as the magnitude of change in voltage, and thus, information recorded on the magnetic recording medium 300 is read out.

In the embodiment, in the ferromagnetic layer 26, the inner ferromagnetic layer 26a is magnetically coupled to the outer ferromagnetic layer 26c with the coupling layer 26b in between, and the orientation of the magnetization Mp of the inner ferromagnetic layer 26a is parallel and opposite to the orientation of the magnetization Mpc of the outer ferromagnetic layer 26c, so that the thermal stability can be improved.

Furthermore, the average in-surface crystal particle diameter of at least the inner ferromagnetic layer 26a lies between 3 nm and 8 nm inclusive, so that the interface between the inner ferromagnetic layer 26a and the coupling layer 26b and the interface between the coupling layer 26b and the outer ferromagnetic layer 26c become flattened. Therefore, the thermal stability of the stack 20 further improves, and the exchange coupling magnetic field increases. In addition, the exchange coupling magnetic field increases, so that the rate of resistance change also increases.

Moreover, the orientation of the magnetization Mp of the inner ferromagnetic layer 26a is parallel and opposite to the orientation of the magnetization Mpc of the outer ferromagnetic layer 26c, so that an influence of magnetization of the ferromagnetic layer 26 upon the soft magnetic layer (the first soft magnetic layer 23 and the second soft magnetic layer 24) diminishes, and therefore the symmetry of output of the thin film magnetic head 100 improves.

<Method of Manufacturing MR Element and Thin Film Magnetic Head>

Next, a method of manufacturing the MR element 110 and the thin film magnetic head 100 will be described with reference to FIGS. 8 to 13B. FIG. 8, FIGS. 12A and 12B and FIGS. 13A and 13B show a sectional structure taken along the line V—V of FIG. 4. FIGS. 9A to 11B show a sectional structure taken along the line VI—VI of FIG. 4.

Figure 8:
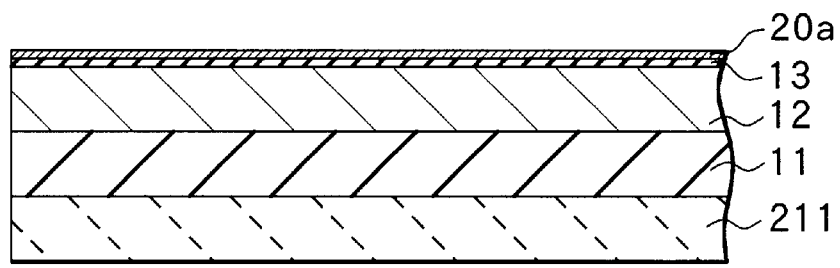
FIG. 8 is a sectional view for describing a step of a method of manufacturing the thin film magnetic head shown in FIG. 3.

In the manufacturing method according to the embodiment, first of all, as shown in FIG. 8, for example, the insulating layer 11 is formed on one side of the base 211 made of $Al_2O_3$—TiC by means of sputtering using the material mentioned in the description of the configuration. Then, the bottom shield layer 12 is formed on the insulating layer 11 by means of, for example, plating using the material mentioned in the description of the configuration. Then, the bottom shield gap layer 13 is formed on the bottom shield layer 12 by means of, for example, sputtering using the material mentioned in the description of the configuration. After that, a stacked film 20a for forming the stack 20 is formed on the bottom shield gap layer 13.

Figure 9A:
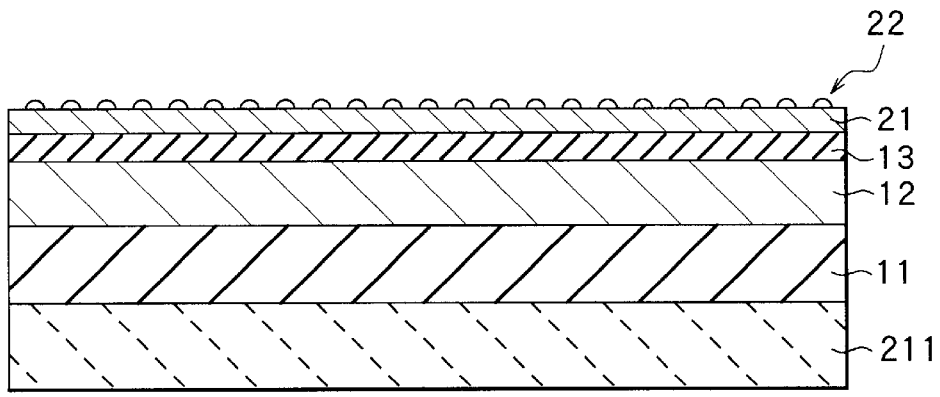
FIGS. 9A to 9C are sectional views for describing the step shown in FIG. 8 in detail.
Figure 9B:
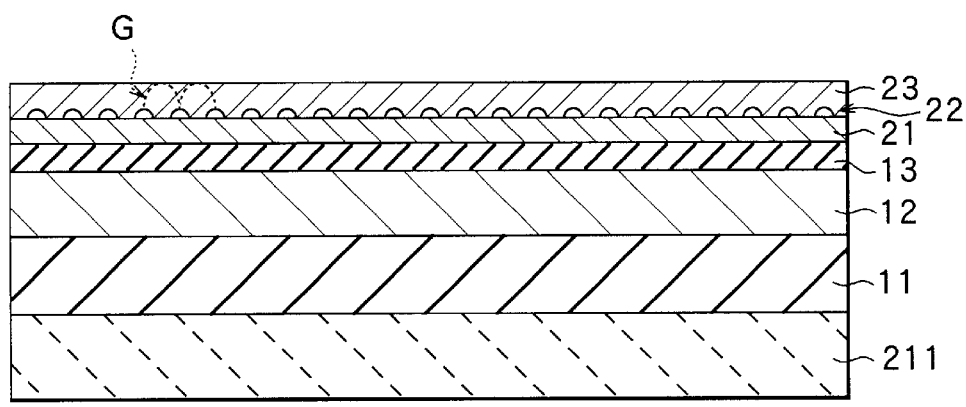
Figure 9C:
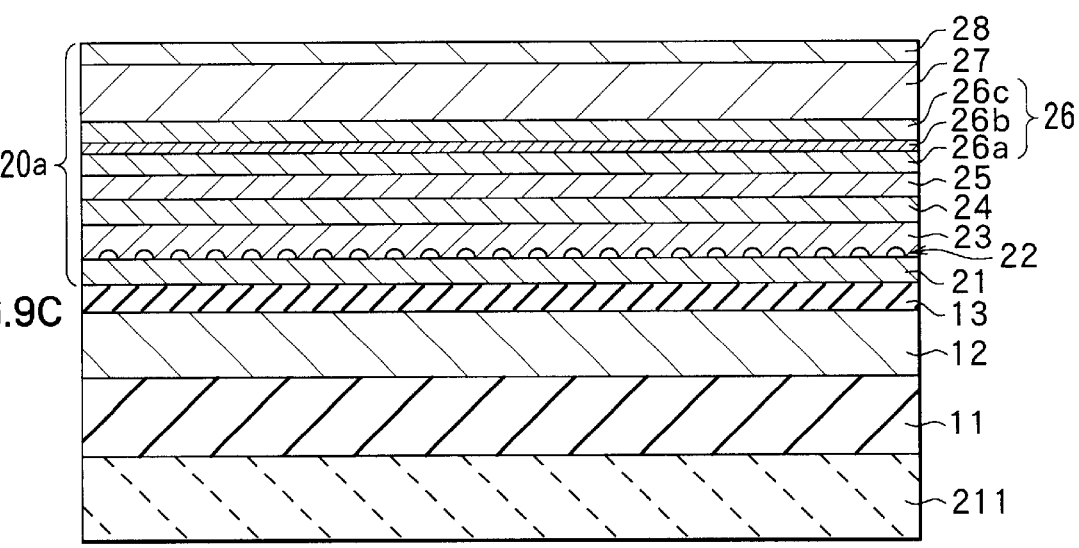

A step of forming the stacked film 20a and a step of forming the stack 20 will be now described in detail. Firstly, as shown in FIG. 9A, the underlayer 21 is formed on the bottom shield gap layer 13 by means of, for example, sputtering using the material mentioned in the description of the configuration. This formation takes place under a high vacuum using a vacuum chamber (not shown). Then, the crystal-growth inhibitor layer 22 made of a material containing at least one element in a group consisting of O, N, H, Cu, Au, Ag and Rh is dispersedly formed like islands on a surface of the underlayer 21.

To form the crystal-growth inhibitor layer 22 made of a material containing at least one element in a group consisting of O, N and H, at least one of an $O_2$ gas, an $N_2$ gas and an $H_2O$ gas is introduced into the above-mentioned vacuum chamber (not shown), and thus the surface of the underlayer 21 is exposed to an atmosphere containing at least one element in a group consisting of O, N and H. For example, when the $O_2$ gas is introduced into the vacuum chamber, the optimum degree of vacuum in the vacuum chamber is $1 \times 10^{-3}$ Pa to 1 Pa. Vacuum deposition is used to form the crystal-growth inhibitor layer 22 made of a material containing at least one element in a group consisting of Cu, Au, Ag and Rh. Herein, vacuum deposition refers to a method in which deposition takes place under a lower pressure than atmospheric pressure (about $1 \times 10^5$ Pa), such as PVD (physical vapor deposition) and CVD (chemical vapor deposition).

Subsequently, a high vacuum is produced in the vacuum chamber (not shown), and then the first soft magnetic layer 23 is formed on the surface of the underlayer 21 coated with the crystal-growth inhibitor layer 22 by means of, for example, sputtering using the material mentioned in the description of the configuration. As indicated by reference symbol G in FIG. 9B, the first soft magnetic layer 23 is grown on the underlayer 21 with the crystal-growth inhibitor layer 22 dispersed like islands in between, so that the crystal growth of the first soft magnetic layer 23 is inhibited. In the embodiment, the average in-surface crystal particle diameter of the first soft magnetic layer 23 lies between 3 nm and 8 nm inclusive.

Then, the second soft magnetic layer 24, the nonmagnetic layer 25, the inner ferromagnetic layer 26a, the coupling layer 26b and the outer ferromagnetic layer 26c are formed in sequence on the first soft magnetic layer 23 by use of the materials mentioned in the description of the configuration. In the embodiment, the average in-surface crystal particle diameter of the first soft magnetic layer 23 is as small as 3 nm to 8 nm, and thus a surface of the first soft magnetic layer 23 becomes flattened, so that the crystal growth of the second soft magnetic layer 24, the nonmagnetic layer 25, the inner ferromagnetic layer 26a, the coupling layer 26b and the outer ferromagnetic layer 26c, which are formed on the first soft magnetic layer 23, is also inhibited, and, as a result, the average in-surface crystal particle diameters of these layers also lie between 3 nm and 8 nm inclusive. Therefore, in the ferromagnetic layer 26, the interface between the inner ferromagnetic layer 26a and the coupling layer 26b and the interface between the coupling layer 26b and the outer ferromagnetic layer 26c become flattened.

The interface between the inner ferromagnetic layer 26a and the coupling layer 26b of the ferromagnetic layer 26 and the interface between the coupling layer 26b and the outer ferromagnetic layer 26c thereof become flattened as described above, so that the thermal stability improves and moreover the exchange coupling magnetic field increases.

The antiferromagnetic layer 27 and the cap layer 28 are formed in sequence on the ferromagnetic layer 26 by means of, for example, sputtering using the materials mentioned in the description of the configuration. To form the antiferromagnetic layer 27 made of the non-heat-treatment type antiferromagnetic material, the antiferromagnetic layer 27 is formed with a magnetic field applied in the y-direction (see FIG. 7), for example. Thus, the orientation of magnetization of the ferromagnetic layer 26 is fixed in the direction y of the applied magnetic field by exchange coupling between the ferromagnetic layer 26 and the antiferromagnetic layer 27.

Figure 10A:
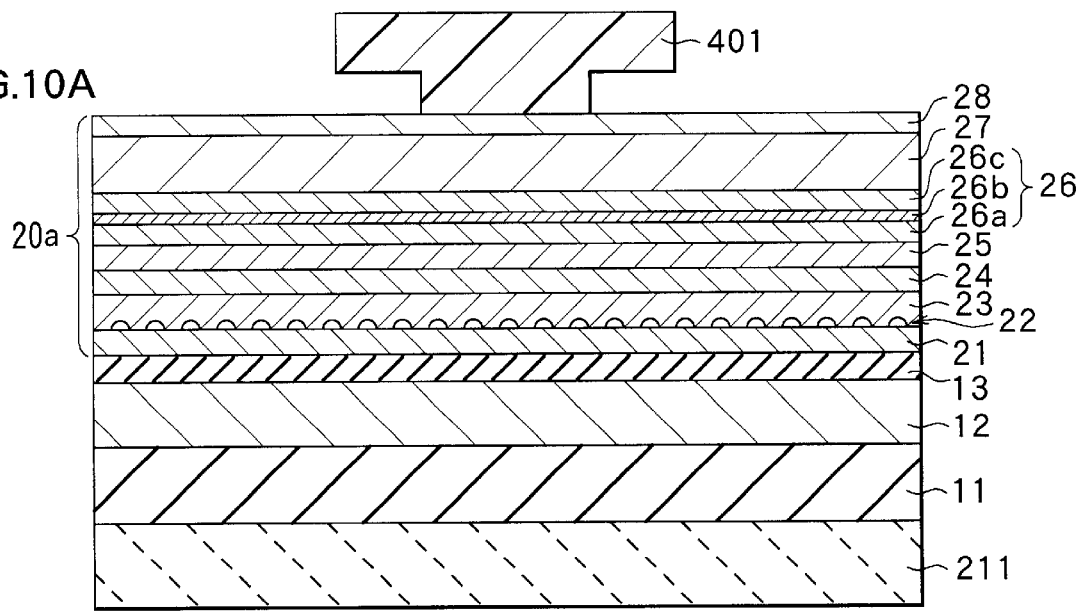
FIGS. 10A and 10B are sectional views for describing a step following the step shown in FIGS. 9A to 9C.
Figure 10B:
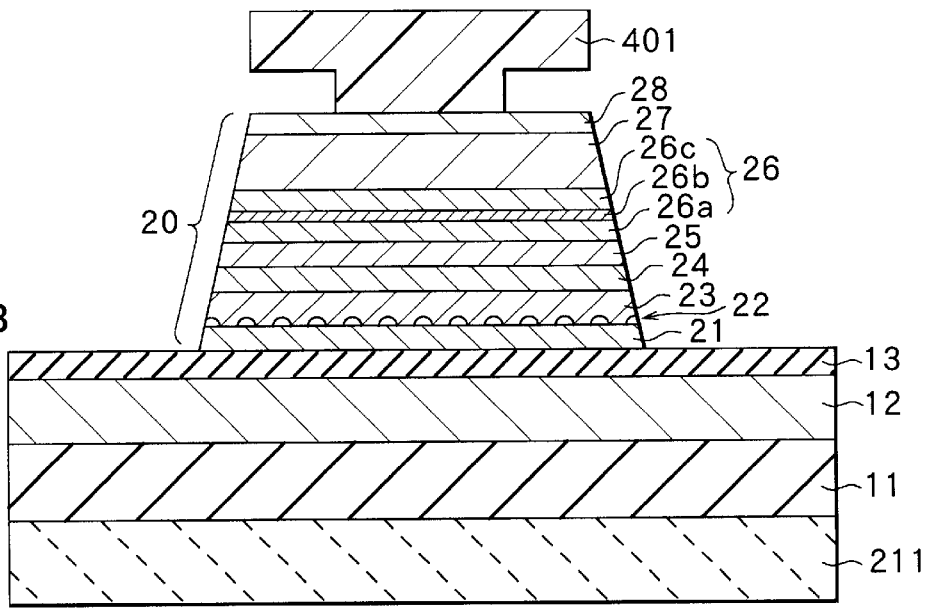

After that, as shown in FIG. 10A, a photoresist film 401 is selectively formed on the stacked film 20a at a position corresponding to a region in which the stack 20 is to be formed. Preferably, the photoresist film 401 has a T shape in cross section so as to facilitate lift-off procedures to be described later, and, for example, the T shape is formed by forming a trench in an interface between the photoresist film 401 and the cap layer 28. After forming the photoresist film 401, the stacked film 20a is etched by means of, for example, ion milling using the photoresist film 401 as a mask. Thus, the stack 20 is formed as shown in FIG. 10B.

Figure 11A:
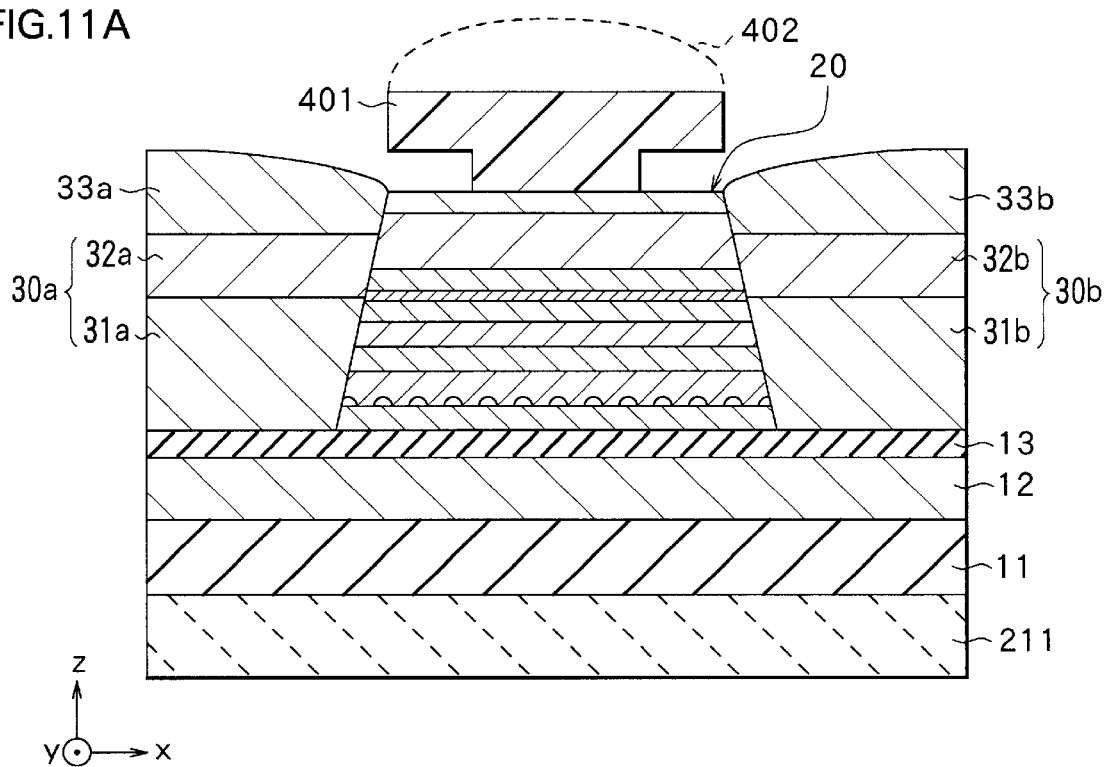
FIGS. 11A and 11B are sectional views for describing a step following the step shown in FIGS. 10A and 10B.

After forming the stack 20, as shown in FIG. 11A, the magnetic domain controlling ferromagnetic films 31a and 31b and the magnetic domain controlling antiferromagnetic films 32a and 32b are formed in sequence on both sides of the stack 20 by means of sputtering, for example. To form the magnetic domain controlling antiferromagnetic films 32a and 32b made of the non-heat-treatment type antiferromagnetic material, the magnetic domain controlling antiferromagnetic films 32a and 32b are formed with a magnetic field applied in the x-direction, for example. Thus, the orientations of magnetizations of the magnetic domain controlling ferromagnetic films 31a and 31b are fixed in the direction x of the applied magnetic field by exchange coupling between the magnetic domain controlling ferromagnetic films 31a and 31b and the magnetic domain controlling antiferromagnetic films 32a and 32b.

After forming the magnetic domain control films 30a and 30b, as shown in FIG. 11A, the lead layers 33a and 33b are formed on the magnetic domain controlling antiferromagnetic films 32a and 32b, respectively, by means of sputtering, for example. After that, the photoresist film 401 and a deposit 402 stacked on the photoresist film 401 (the materials of the magnetic domain controlling ferromagnetic film, the magnetic domain controlling antiferromagnetic film and the lead layer) are removed by means of lift-off procedures, for example.

Figure 11B:
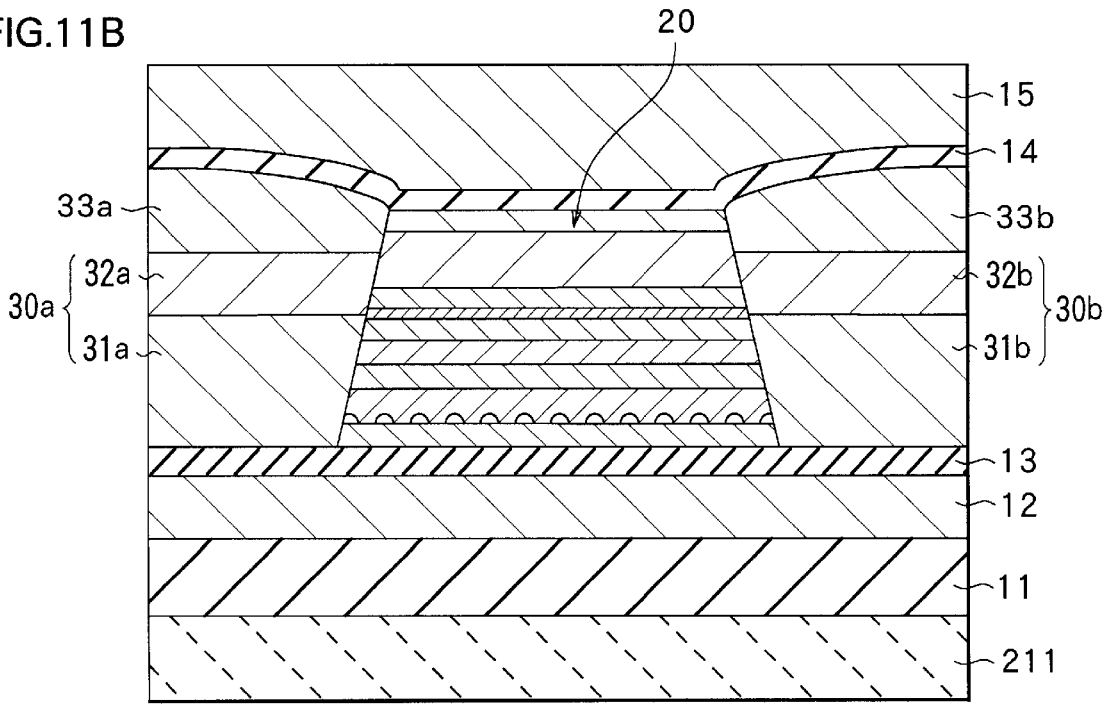

After lift-off procedures, as shown in FIGS. 11B and 12A, the top shield gap layer 14 is formed by means of, for example, sputtering using the material mentioned in the description of the configuration, so as to coat the bottom shield gap layer 13 and the stack 20. Thus, the stack 20 is sandwiched in between the bottom shield gap layer 13 and the top shield gap layer 14. After that, the top shield layer 15 is formed on the top shield gap layer 14 by means of, for example, sputtering using the material mentioned in the description of the configuration.

After forming the top shield layer 15, as shown in FIG. 12B, the write gap layer 41 is formed on the top shield layer 15 by means of, for example, sputtering using the material mentioned in the description of the configuration, and then the photoresist layer 42 is formed into a predetermined pattern on the write gap layer 41. After forming the photoresist layer 42, the thin film coil 43 is formed on the photoresist layer 42 by using the material mentioned in the description of the configuration, and then the photoresist layer 44 is formed into a predetermined pattern so as to coat the thin film coil 43. After forming the photoresist layer 44, the thin film coil 45 is formed on the photoresist layer 44 by using the material mentioned in the description of the configuration, and then the photoresist layer 46 is formed into a predetermined pattern so as to coat the thin film coil 45.

Figure 13A:
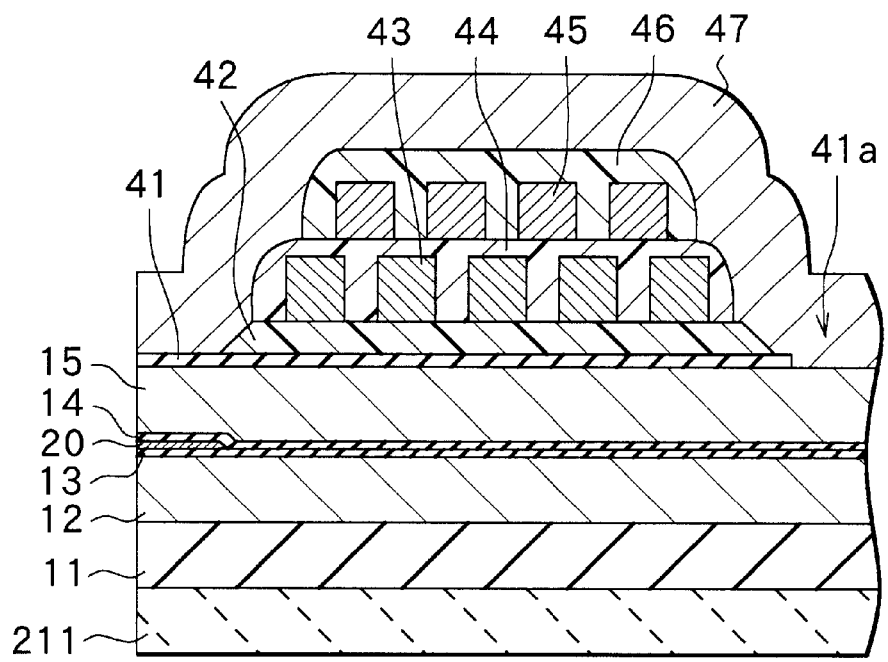
FIGS. 13A and 13B are sectional views for describing a step following the step shown in FIGS. 12A and 12B.
Figure 13B:
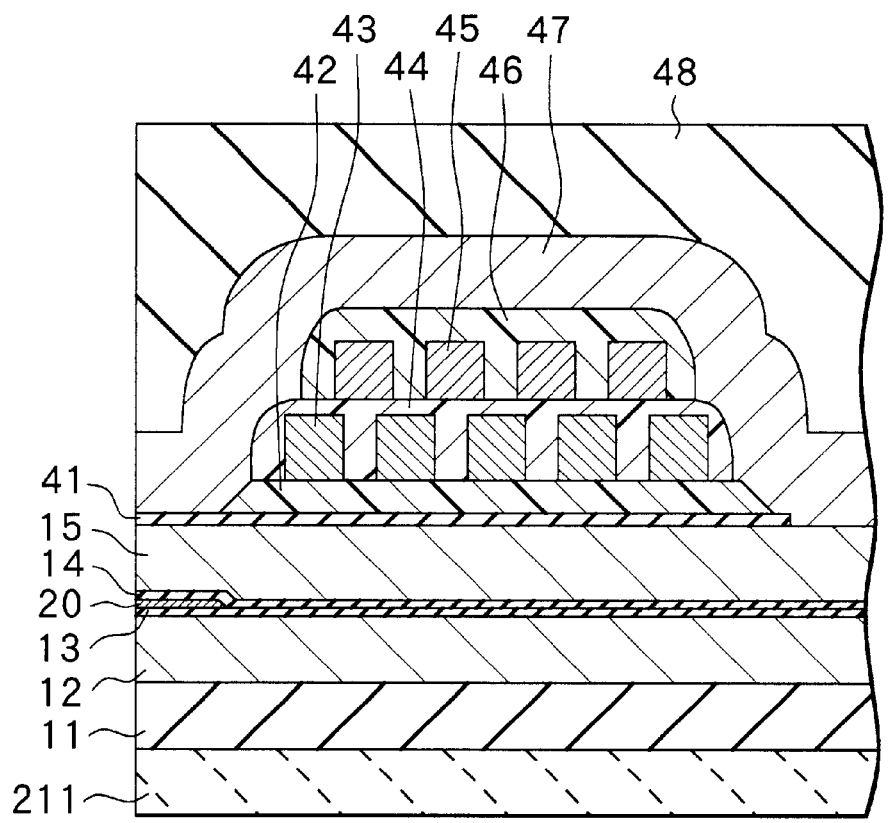

After forming the photoresist layer 46, as shown in FIG. 13A, for example, the write gap layer 41 is partly etched at the position corresponding to the center of the thin film coils 43 and 45, and thus the opening 41a for forming a magnetic path is formed. After that, for example, the top pole 47 is formed on the write gap layer 41, the opening 41a and the photoresist layers 42, 44 and 46 by using the material mentioned in the description of the configuration. After forming the top pole 47, for example, the write gap layer 41 and the top shield layer 15 are selectively etched by means of ion milling using the top pole 47 as a mask. After that, as shown in FIG. 13B, the overcoat layer 48 is formed on the top pole 47 by using the material mentioned in the description of the configuration.

After forming the overcoat layer 48, an antiferromagnetizing process for fixing the orientations of magnetic fields of the ferromagnetic layer 26 and the magnetic domain controlling ferromagnetic films 31a and 31b takes place, for example, to form the ferromagnetic layer 26 of the stack 20 and the magnetic domain controlling ferromagnetic films 31a and 31b by the heat-treatment type antiferromagnetic material. Specifically, when a blocking temperature of the antiferromagnetic layer 27 and the ferromagnetic layer 26 (a temperature at which exchange coupling can occur on an interface) is higher than a blocking temperature of the magnetic domain controlling antiferromagnetic films 32a and 32b and the magnetic domain controlling ferromagnetic films 31a and 31b, the thin film magnetic head 100 is heated to the blocking temperature of the antiferromagnetic layer 27 and the ferromagnetic layer 26 with a magnetic field applied in, for example, the y-direction by use of a magnetic field generating apparatus or the like. Thus, the orientation of magnetization of the ferromagnetic layer 26 is fixed in the direction y of the applied magnetic field by exchange coupling between the ferromagnetic layer 26 and the antiferromagnetic layer 27. Then, the thin film magnetic head 100 is cooled to the blocking temperature of the magnetic domain controlling antiferromagnetic films 32a and 32b and the magnetic domain controlling ferromagnetic films 31a and 31b, and thus a magnetic field is applied in the x-direction, for example. Thus, the orientations of magnetizations of the magnetic domain controlling ferromagnetic films 31a and 31b are fixed in the direction x of the applied magnetic field by exchange coupling between the magnetic domain controlling ferromagnetic films 31a and 31b and the magnetic domain controlling antiferromagnetic films 32a and 32b.

When the blocking temperature of the antiferromagnetic layer 27 and the ferromagnetic layer 26 is lower than the blocking temperature of the magnetic domain controlling antiferromagnetic films 32a and 32b and the magnetic domain controlling ferromagnetic films 31a and 31b, the process is the reverse of the above-described procedure. Heat treatment is not necessary to form the antiferromagnetic layer 27 or the magnetic domain controlling antiferromagnetic films 32a and 32b by the non-heat-treatment type antiferromagnetic material. In the embodiment, heat treatment for antiferromagnetizing takes place after forming the overcoat layer 48. However, heat treatment may take place before forming the overcoat layer 48, after forming the ferromagnetic layer 26 and the antiferromagnetic layer 27. Alternatively, heat treatment may take place before forming the overcoat layer 48, after forming the magnetic domain control films 30a and 30b.

Finally, the air bearing surface is formed by, for example, machining the slider, and thus the thin film magnetic head 100 shown in FIG. 3 or 5 is completed.

<Advantages of First Embodiment>

As described above, according to the embodiment, the average in-surface crystal particle diameter of the inner ferromagnetic layer 26a lies between 3 nm and 8 nm inclusive, or more particularly the average in-surface crystal particle diameter of the interface between the inner ferromagnetic layer 26a and the coupling layer 26b lies between 3 nm and 8 nm inclusive, so that both the interface between the inner ferromagnetic layer 26a and the coupling layer 26b and the interface between the coupling layer 26b and the outer ferromagnetic layer 26c can become flattened. Therefore, the thermal stability can be improved, and the exchange coupling magnetic field can be increased. In addition, the exchange coupling magnetic field is increased, so that the rate of resistance change can be also increased.

Moreover, the crystal-growth inhibitor layer 22 is provided on the surface of the underlayer 21, and thus an adverse influence of the existence of an impurity upon reproducing head characteristics can be minimized.

Furthermore, to form the crystal-growth inhibitor layer 22 made of a material containing at least one of O, N and H, a portion of the stack 20 in which the crystal-growth inhibitor layer 22 is to be formed is exposed to an atmosphere containing at least one of O, N and H, and thus the crystal-growth inhibitor layer 22 can be formed through a simple method. Alternatively, vacuum deposition is used to form the crystal-growth inhibitor layer 22 made of a material containing at least one of Cu, Au, Ag and Rh, and thus the crystal-growth inhibitor layer 22 can be formed through a simple method.

Additionally, the crystal-growth inhibitor layer 22 is dispersedly formed in the surface perpendicular to the stacking direction of the stack 20, and thus the crystal growth of the layers formed on the crystal-growth inhibitor layer 22 can be easily inhibited.

In the above description, the crystal-growth inhibitor layer 22 is formed between the underlayer 21 and the first soft magnetic layer 23, but the crystal-growth inhibitor layer 22 may be formed between the first soft magnetic layer 23 and the second soft magnetic layer 24 or between the second soft magnetic layer 24 and the nonmagnetic layer 25. Alternatively, the crystal-growth inhibitor layer 22 may be formed within the underlayer 21, the first soft magnetic layer 23, the second soft magnetic layer 24 or the nonmagnetic layer 25. When the average in-surface crystal particle diameter of at least the inner ferromagnetic layer 26a lies between 3 nm and 8 nm inclusive, the average in-surface crystal particle diameters of the underlayer 21, the first soft magnetic layer 23, the second soft magnetic layer 24, the nonmagnetic layer 25, the coupling layer 26b and the outer ferromagnetic layer 26c may not be within the range from 3 nm to 8 nm inclusive.

[Second Embodiment]

Next, a second embodiment of the invention will be described with reference to FIG. 14. In the second embodiment, the layers from the first soft magnetic layer 23 to the antiferromagnetic layer 27 are stacked in reverse order to the order in the first embodiment. In the second embodiment, the same components as the components of the first embodiment are indicated by the same reference numerals, and the detailed description of the same components is omitted.

Figure 14:
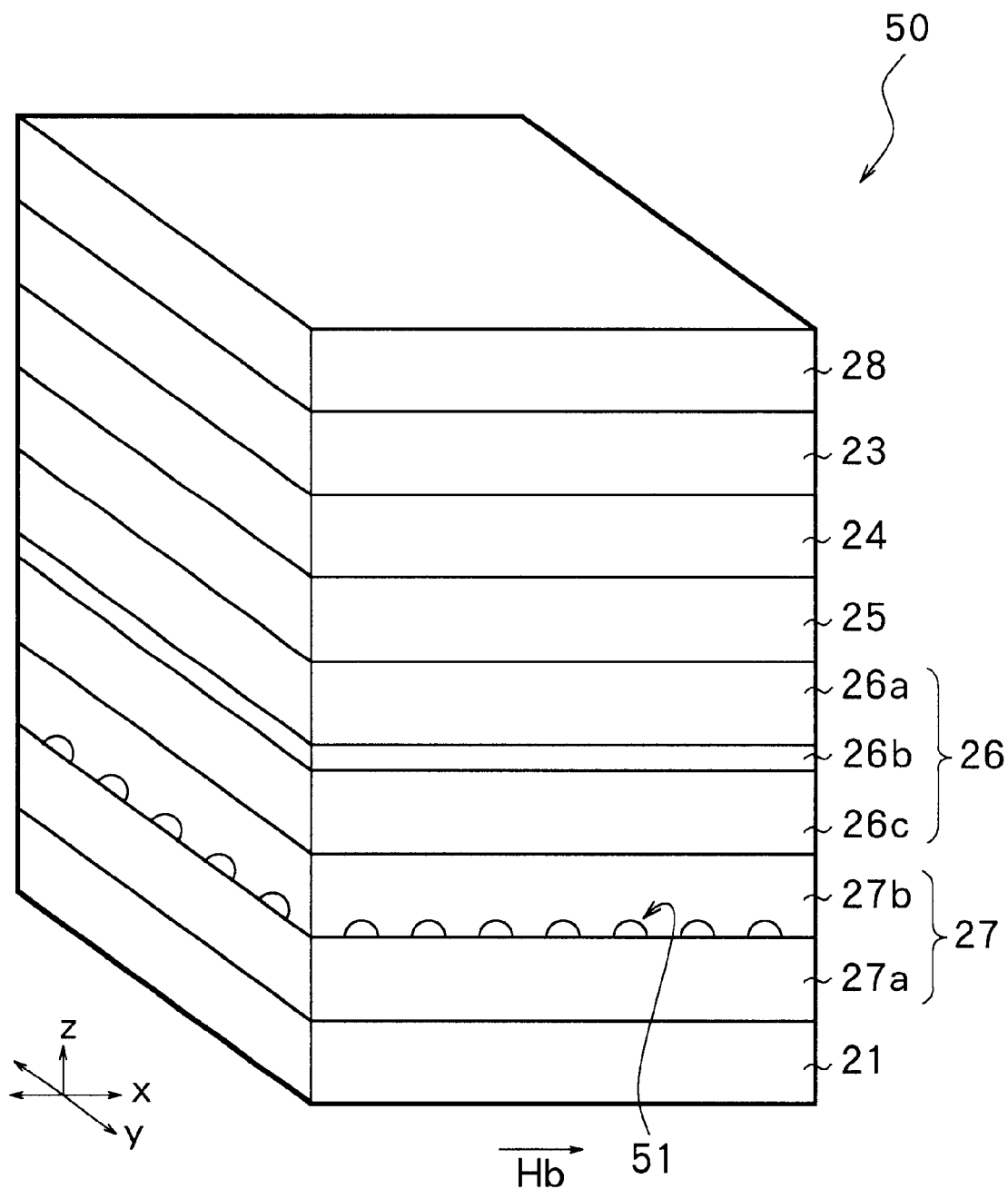
FIG. 14 is a perspective view of a configuration of a stack of a magnetic transducer according to a second embodiment.

FIG. 14 shows a configuration of a stack 50 of the second embodiment. The stack 50 has a stacked structure comprising the underlayer 21, the antiferromagnetic layer 27, the outer ferromagnetic layer 26c, the coupling layer 26b, the inner ferromagnetic layer 26a, the nonmagnetic layer 25, the second soft magnetic layer 24, the first soft magnetic layer 23 and the cap layer 28, which are stacked in this order on the underlayer 21.

In the second embodiment, a crystal-growth inhibitor layer 51 is provided within, for example, the antiferromagnetic layer 27, and thus the average in-surface crystal particle diameter of the outer ferromagnetic layer 26c, in particular the average in-surface crystal particle diameter of the interface of the outer ferromagnetic layer 26c with the coupling layer 26b, is limited to within the range from 3 nm to 8 nm inclusive. The crystal-growth inhibitor layer 51 can be provided at a position closer to the base 211 (see FIG. 5) with respect to the coupling layer 26b, similarly to the crystal-growth inhibitor layer 22 of the first embodiment. Preferably, the coupling layer 26b is provided within the antiferromagnetic layer 27, because an adverse influence of the existence of an impurity upon the reproducing head characteristics can be minimized and the average in-surface crystal particle diameter of the outer ferromagnetic layer 26c can be easily controlled. In the second embodiment, "the position closer to the base 211 with respect to the coupling layer 26b" refers to a position closer to the antiferromagnetic layer 27 with respect to the coupling layer 26b in the stack 50.

In the antiferromagnetic layer 27, a portion below the crystal-growth inhibitor layer 51 (closer to the base 211) is a lower antiferromagnetic layer 27a, and a portion above the crystal-growth inhibitor layer 51 (closer to the ferromagnetic layer 26) is an upper antiferromagnetic layer 27b.

The stack 50 of the second embodiment is manufactured in the following manner. That is, the lower antiferromagnetic layer 27a is formed on the underlayer 21 by means of sputtering, for example. This formation takes place in a vacuum chamber (not shown), as in the case of the first embodiment. Then, the crystal-growth inhibitor layer 51 containing at least one element in a group consisting of O, N, H, Cu, Au, Ag and Rh is formed like islands on a surface of the lower antiferromagnetic layer 27a. As in the case of the first embodiment, to form the crystal-growth inhibitor layer 51 made of a material containing at least one element in a group consisting of O, N and H, an $O_2$ gas, an $N_2$ gas and an $H_2O$ gas are introduced into the vacuum chamber. When the $O_2$ gas is introduced into the vacuum chamber, the degree of vacuum in the vacuum chamber is $1 \times 10^{-3}$ Pa to 1 Pa, for example. Vacuum deposition is used to form the crystal-growth inhibitor layer 51 made of a material containing at least one element in a group consisting of Cu, Au, Ag and Rh.

Subsequently, a high vacuum is produced in the vacuum chamber (not shown), and then the upper antiferromagnetic layer 27b is further formed on the surface of the lower antiferromagnetic layer 27a coated with the crystal-growth inhibitor layer 51 by means of sputtering, for example. A crystal of the upper antiferromagnetic layer 27b grows in a gap between the dispersed crystal-growth inhibitor layers 51, so that the crystal growth is inhibited, and therefore the average in-surface crystal particle diameter lies between 3 nm and 8 nm inclusive, for example. The outer ferromagnetic layer 26c, the coupling layer 26b, the inner ferromagnetic layer 26a, the nonmagnetic layer 25, the second soft magnetic layer 24, the first soft magnetic layer 23 and the cap layer 28 are formed in sequence on the upper antiferromagnetic layer 27b by means of sputtering, for example. The materials of the underlayer 21, the antiferromagnetic layer 27, the inner ferromagnetic layer 26a, the coupling layer 26b, the outer ferromagnetic layer 26c, the nonmagnetic layer 25, the second soft magnetic layer 24, the first soft magnetic layer 23 and the cap layer 28 are the same as those of these layers of the first embodiment.

In the second embodiment, the average in-surface crystal particle diameter of the upper antiferromagnetic layer 27b of the antiferromagnetic layer 27 is limited to within the range from 3 nm to 8 nm inclusive, so that the crystal growth of the inner ferromagnetic layer 26a, the coupling layer 26b and the outer ferromagnetic layer 26c formed on the upper antiferromagnetic layer 27b is inhibited, and therefore the average in-surface crystal particle diameters of these layers lie between 3 nm and 8 nm inclusive, for example. Therefore, the interface between the inner ferromagnetic layer 26a and the coupling layer 26b and the interface between the coupling layer 26b and the outer ferromagnetic layer 26c become flattened, as in the case of the first embodiment. Accordingly, the thermal stability can be improved, and the exchange coupling magnetic field can be increased. In addition, the exchange coupling magnetic field is increased, so that the rate of resistance change can be also increased.

In the above description, the crystal-growth inhibitor layer 51 is provided within the antiferromagnetic layer 27, but, as in the case of the first embodiment, the crystal-growth inhibitor layer 51 may be formed on the surface of the underlayer 21, and, in this case, the precisely identical advantages can be obtained. Alternatively, the crystal-growth inhibitor layer 51 may be formed within the underlayer 21.

EXAMPLE

Specific examples of the invention will be described in detail.

Examples 1 to 5

The stacks 20 shown in FIG. 7 were made as examples 1 to 5.

Each stack 20 was made in the following manner. First, in a vacuum chamber, the underlayer 21 of 3 nm thick was formed of Ta by means of sputtering on an insulating substrate made of $Al_2O_3$—TiC on which an $Al_2O_3$ film was formed. Then, an $O_2$ gas was introduced into the vacuum chamber so that the degree of vacuum in the vacuum chamber was $5 \times 10^{-3}$ Pa, and thus O was absorbed on the surface of the underlayer 21, whereby the crystal-growth inhibitor layer 22 was formed. Then, the first soft magnetic layer 23 of 2 nm thick was formed of NiFe on the crystal-growth inhibitor layer 22, then the second soft magnetic layer 24 of 2 nm thick was formed of CoFe on the first soft magnetic layer 23, and then the nonmagnetic layer 25 of 2.1 nm thick was formed of Cu on the second soft magnetic layer 24. The inner ferromagnetic layer 26a of 3 nm thick was formed of CoFe on the nonmagnetic layer 25, then the coupling layer 26b was formed of Ru on the inner ferromagnetic layer 26a, and then the outer ferromagnetic layer 26c of 1 nm thick was formed of CoFe on the coupling layer 26b. In the examples 1 to 5, the coupling layers 26b had varying thicknesses as shown in Table 1. The antiferromagnetic layer 27 of 13 nm thick was formed of PtMn on the outer ferromagnetic layer 26c, and then the cap layer 28 of 3 nm thick was formed of Ta on the antiferromagnetic layer 27. Since a heat-treatment type antiferromagnetic material (PtMn) was used to form the antiferromagnetic layer 27, the antiferromagnetizing process was performed through heating at 250 degrees for 5 hours after forming the antiferromagnetic layer 27.

TABLE 1

| | Thickness of coupling layer (nm) |
|---|---|
| Example 1 | 0.6 |
| Example 2 | 0.7 |
| Example 3 | 0.8 |
| Example 4 | 0.9 |
| Example 5 | 1.0 |
| Comparison 1 | 0.6 |
| Comparison 2 | 0.7 |
| Comparison 3 | 0.8 |
| Comparison 4 | 0.9 |
| Comparison 5 | 1.0 |

In the step of manufacturing the stack 20 of the example 4 of the examples 1 to 5, the underlayer 21, the crystal-growth inhibitor layer 22, the first soft magnetic layer 23, the second soft magnetic layer 24, the nonmagnetic layer 25 and the inner ferromagnetic layer 26a were formed in sequence, and thereafter the average in-surface crystal particle diameter of the inner ferromagnetic layer 26a was measured through the observation of the surface of the inner ferromagnetic layer 26a by means of a TEM. The result of measurement is shown in Table 2. As comparisons 1 to 5 to the examples 1 to 5, stacks were made under the same conditions as the conditions for the examples 1 to 5, except that the crystal-growth inhibitor layer 22 was not formed. The average in-surface crystal particle diameter of the inner ferromagnetic layer of the stack of the comparison 4 of the comparisons 1 to 5 was measured. The result of measurement is also shown in Table 2.

TABLE 2

|  | Particle diameter measured through observation using TEM (nm) |
|---|---|
| Example 4 | 6.7 |
| Comparison 4 | 12.1 |

It can be seen from Table 2 that the average in-surface crystal particle diameter of the inner ferromagnetic layer 26a of the example 4 is equal to 6.7 nm and the average in-surface crystal particle diameter of the inner ferromagnetic layer of the comparison 4 is equal to 12.1 nm. In other words, it is found that the provision of the crystal-growth inhibitor layer 22 allows limiting the average in-surface crystal particle diameter of the inner ferromagnetic layer 26a.

The exchange coupling magnetic fields of the stacks 20 of the examples 1 to 5 and the stacks of the comparisons 1 to 5 made as described above were measured. The results of measurement are shown in FIG. 15.

Figure 15:
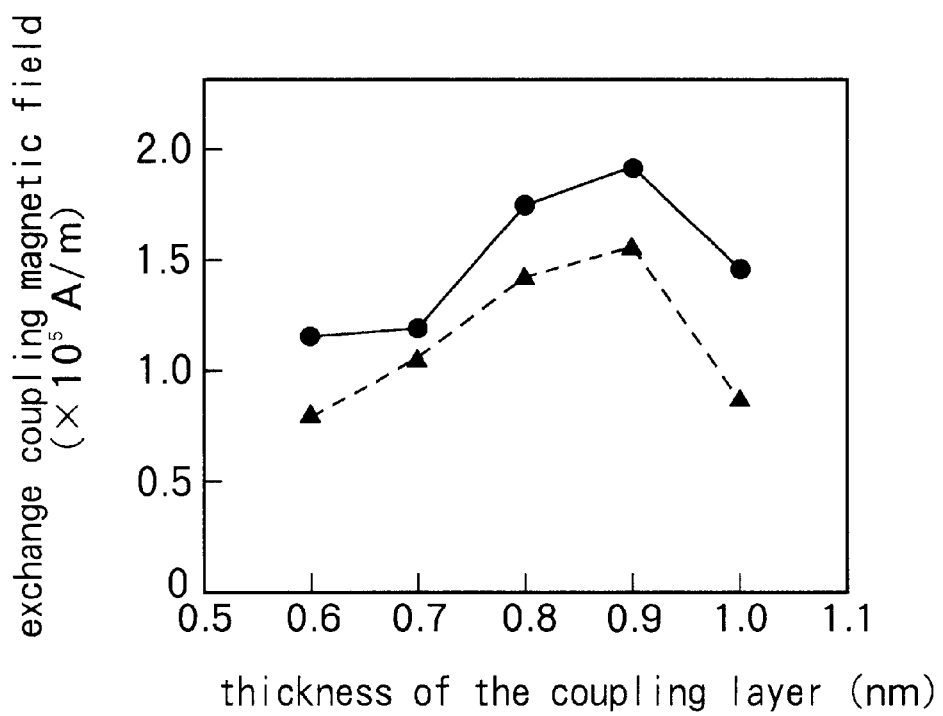
FIG. 15 is a plot of the correlation between the thicknesses of coupling layers and the exchange coupling magnetic fields of magnetic transducers according to examples and comparisons.

It can be seen from FIG. 15 that, although the exchange coupling magnetic field greatly changes according to the thickness of the coupling layer, the exchange coupling magnetic fields of the examples exceed those of the comparisons even if the coupling layer has any thickness. In other words, it is found that the exchange coupling magnetic field can be increased through the provision of the crystal-growth inhibitor layer 22 for inhibiting the crystal growth of the inner ferromagnetic layer 26a. Of the examples 1 to 5, the example 4 having the coupling layer of 0.9 nm thick obtained a maximum exchange coupling magnetic field of $1.9 \times 10^5$ A/m.

Figure 16:
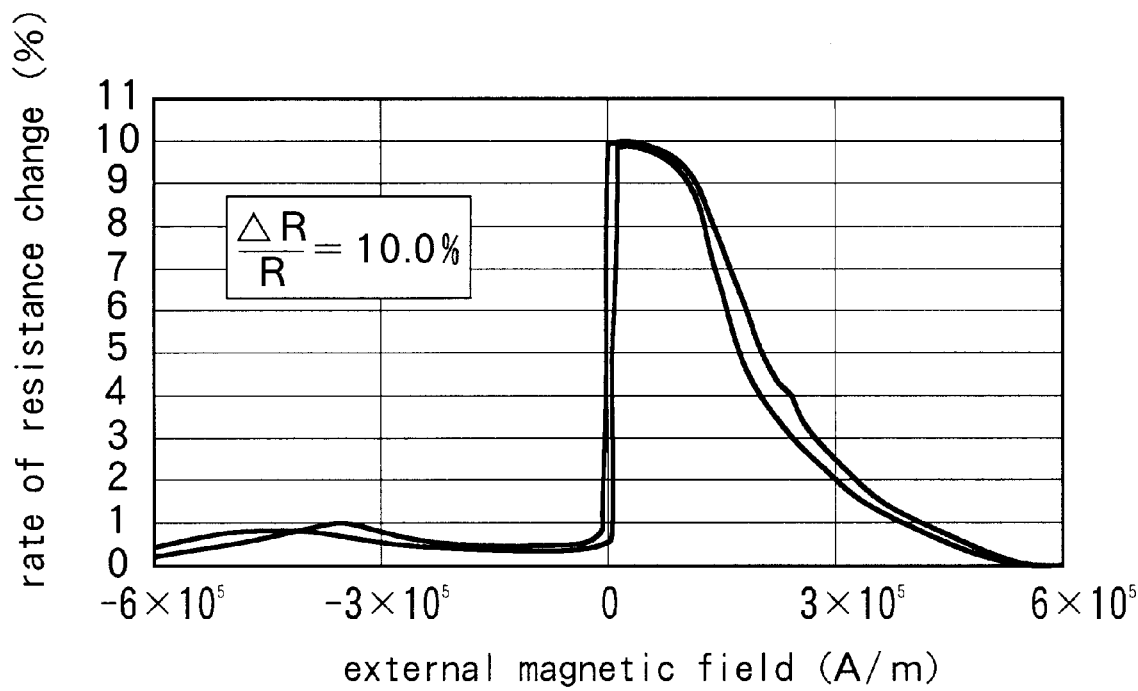
FIG. 16 is a plot of the correlation between the signal magnetic field and the rate of resistance change of the magnetic transducer according to the example.

Next, when a magnetic field was applied to the stack 20 of the example 4 concurrently with the passage of a sense current through the stack 20, a change in resistance versus a change in a signal magnetic field was examined, and the rate of resistance change was calculated. The results of calculation are shown in FIG. 16. The rate of resistance change of the stack of the comparison 4 was calculated in the same manner. The results of calculation are shown in FIG. 17.

Figure 17:
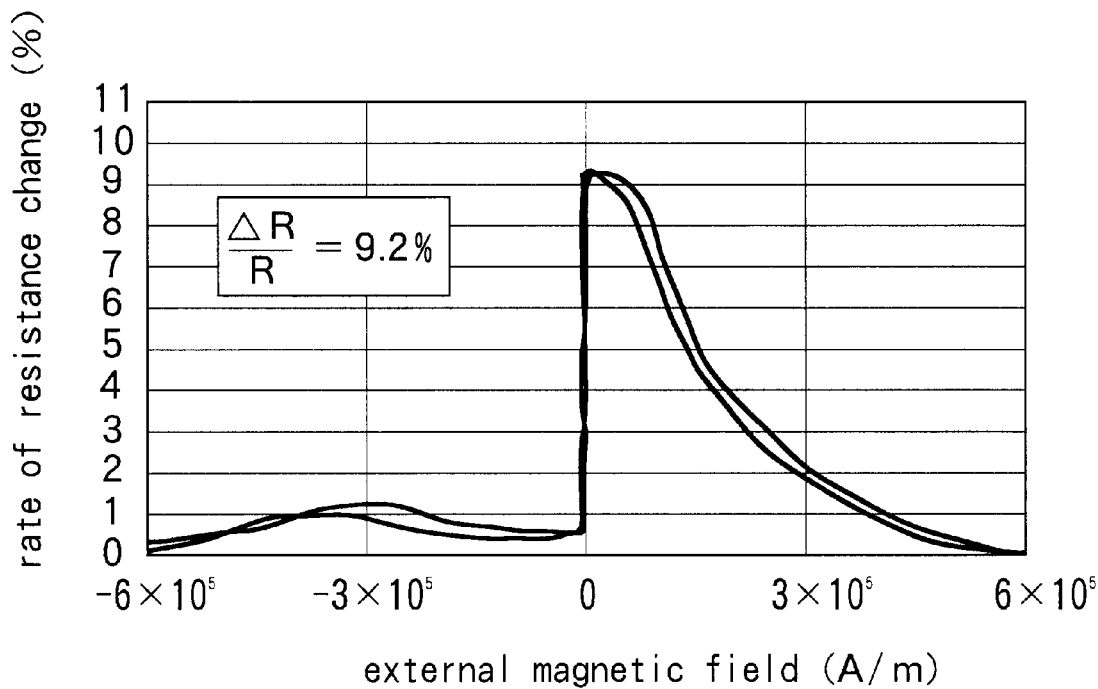
FIG. 17 is a plot of the correlation between the signal magnetic field and the rate of resistance change of the magnetic transducer according to the comparison.

As can be seen from FIGS. 16 and 17, the rate of resistance change of the example 4 is 10.0%, which is higher than 9.2%, the rate of resistance change of the comparison 4. In other words, it is found that the rate of resistance change, as well as the exchange coupling magnetic field, can be increased through the provision of the crystal-growth inhibitor layer 22 for inhibiting the crystal growth of the inner ferromagnetic layer 26a.

Figure 18:
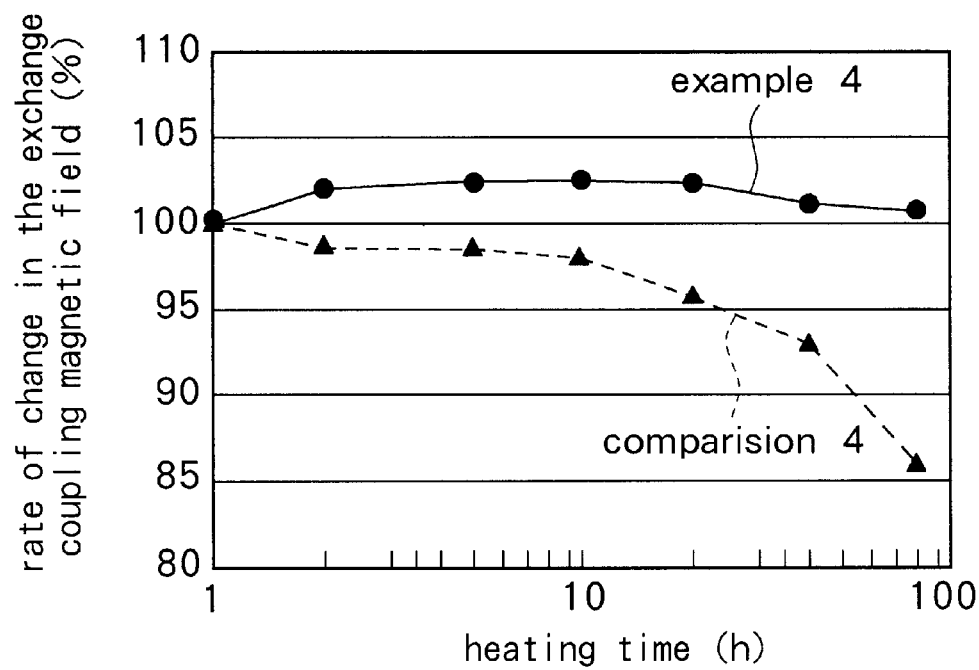
FIG. 18 is a plot of the time-varying exchange coupling magnetic fields of the example and the comparison.
Figure 19:
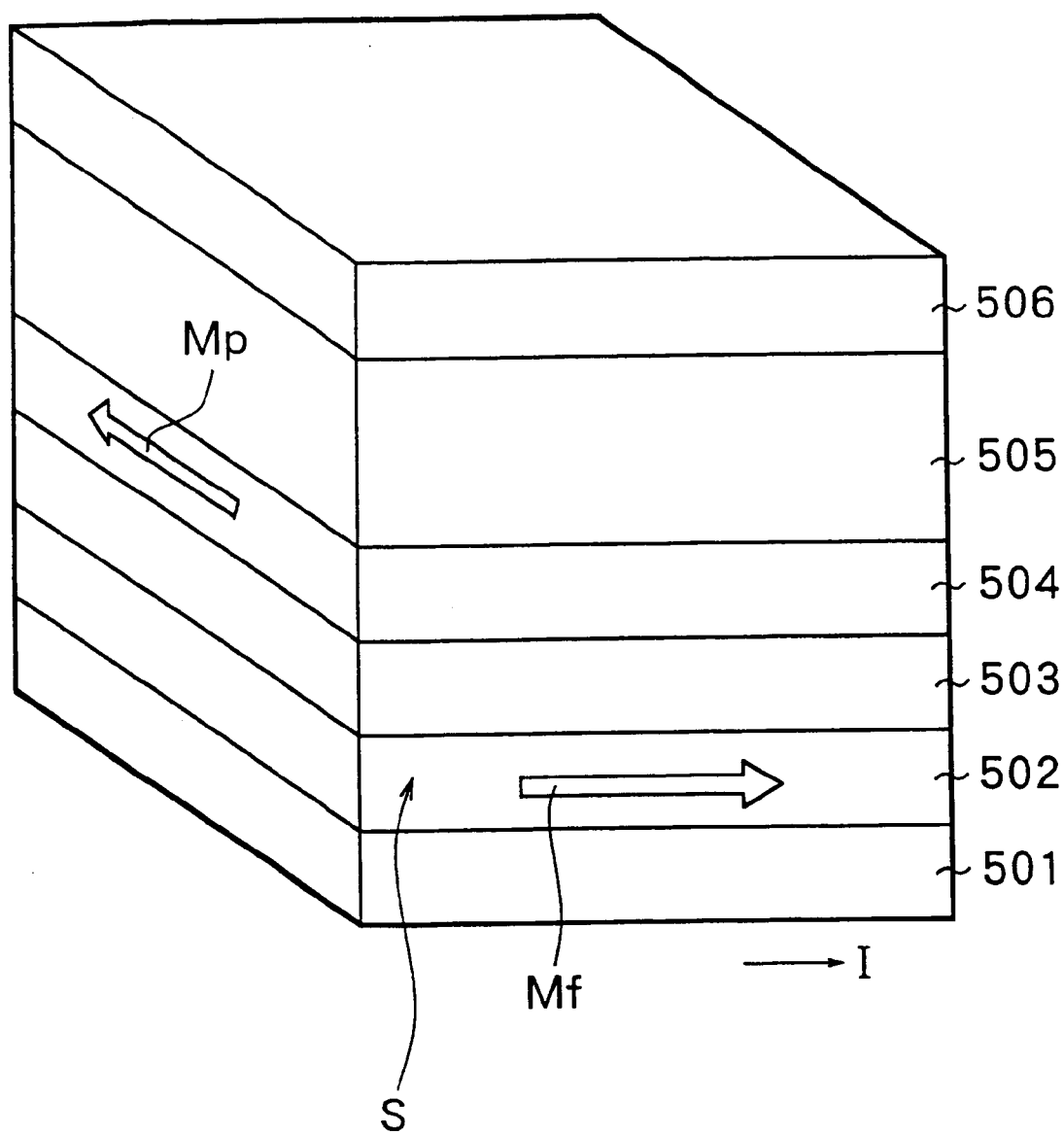
FIG. 19 is a perspective view of a configuration of a stack of a magnetic transducer of the related art.

Next, a heat test was conducted on the stack 20 of the example 4 and the stack of the comparison 4. The heat test was that heat treatment took place at 250 degrees in a vacuum, and the rate of change in the exchange coupling magnetic field after the heat test relative to the exchange coupling magnetic field before the heat test was measured. The results of measurement are shown in FIG. 18. In FIG. 18, the measured values of the exchange coupling magnetic fields may have an error of about plus or minus 3 percent.

As can be seen from FIG. 18, the exchange coupling magnetic field of the comparison 4 decreases considerably after the heating time in excess of 10 hours, whereas the exchange coupling magnetic field of the example 4 varies little from its initial value even after 90-hour heating. In other words, it is found that the thermal stability can be improved through the provision of the crystal-growth inhibitor layer 22 for inhibiting the crystal growth of the inner ferromagnetic layer 26a.

Although the invention has been described above by referring to some embodiments and examples, the invention is not limited to these embodiments and examples and various modifications of the invention are possible. For example, the description has been given with regard to the case in which the soft magnetic layer has a two-layer structure comprising the first soft magnetic layer and the second soft magnetic layer, but the soft magnetic layer may have a single-layer structure or a stacked structure comprising three layers or more.

The magnetic domain controlling ferromagnetic films 31a and 31b and the magnetic domain controlling antiferromagnetic films 32a and 32b may be replaced with a hard magnetic material (a hard magnet) as the magnetic domain control films 30a and 30b shown in FIG. 6. In this case, a stacked film of a TiW (titanium-tungsten alloy) layer and a CoPt (cobalt-platinum alloy) layer, a stacked film of a TiW layer and a CoCrPt (cobalt-chromium-platinum alloy) layer, or the like can be used.

In the above-described embodiments, both the antiferromagnetic layer 27 and the magnetic domain controlling antiferromagnetic films 32a and 32b are made of the heat-treatment type antiferromagnetic material. However, the antiferromagnetic layer 27 and the magnetic domain controlling antiferromagnetic films 32a and 32b may be made of the heat-treatment type antiferromagnetic material and the non-heat-treatment type antiferromagnetic material, respectively. Alternatively, the antiferromagnetic layer 27 and the magnetic domain controlling antiferromagnetic films 32a and 32b may be made of the non-heat-treatment type antiferromagnetic material and the heat-treatment type antiferromagnetic material, respectively. Alternatively, both the antiferromagnetic layer 27 and the magnetic domain controlling antiferromagnetic films 32a and 32b may be made of the non-heat-treatment type antiferromagnetic material.

In the above-mentioned embodiments, the description has been given with regard to the case in which the magnetic transducer of the invention is used in a composite thin film magnetic head, but the magnetic transducer of the invention can be also used in a thin film magnetic head for reproducing only. Moreover, the recording head and the reproducing head may be stacked in reverse order.

Additionally, the configuration of the magnetic transducer of the invention may be applied to a tunnel junction type magnetoresistive film (a TMR film). Furthermore, the magnetic transducer of the invention is applicable to, for example, a sensor (an accelerometer or the like) for detecting a magnetic signal, a memory for storing a magnetic signal, or the like, as well as the thin film magnetic head described by referring to the above-mentioned embodiments.

As described above, according to the magnetic transducer of the invention, the average crystal particle diameter of at least one of the inner ferromagnetic layer and the outer ferromagnetic layer lies between 3 nm and 8 nm inclusive, so that the interface between at least one of the inner and outer ferromagnetic layers and the coupling layer can become flattened, and therefore the thermal stability can be improved, and the exchange coupling magnetic field can be increased.

According to the thin film magnetic head of the invention, the average crystal particle diameter of at least one of the inner ferromagnetic layer and the outer ferromagnetic layer, which is located closer to the base, lies between 3 nm and 8 nm inclusive, so that a pair of interfaces between the coupling layer and the inner and outer ferromagnetic layers can become flattened. Therefore, the thermal stability can be improved, and the exchange coupling magnetic field and the rate of resistance change can be increased.

According to the magnetic transducer or the thin film magnetic head of one aspect of the invention, the crystal-growth inhibitor layer made of a material containing at least one element in a group consisting of O, N, H, Cu, Au, Ag and Rh is provided, thereby facilitating controlling the crystal particle diameter.

According to the method of manufacturing a magnetic transducer of the invention, the crystal-growth inhibitor layer is provided in the stack at a position closer to at least one of the antiferromagnetic layer and the soft magnetic layer with respect to the coupling layer, so that the average in-surface crystal particle diameter of at least one of the inner ferromagnetic layer and the outer ferromagnetic layer can be controlled, and therefore the flatness of the interface between the coupling layer and at least one of the inner and outer ferromagnetic layers can be improved.

According to the method of manufacturing a thin film magnetic head of the invention, the crystal-growth inhibitor layer is provided in the stack at a position closer to at least the base with respect to the coupling layer, so that the crystal growth of the inner ferromagnetic layer, the coupling layer and the outer ferromagnetic layer can be inhibited, and therefore the flatness of the interfaces between the coupling layer and the inner and outer ferromagnetic layers can be improved.

According to the method of manufacturing a magnetic transducer or the method of manufacturing a thin film magnetic head of one aspect of the invention, a portion of the stack in which the crystal-growth inhibitor layer is to be formed is exposed to an atmosphere containing at least one element in a group consisting of O, N and H, so that the crystal-growth inhibitor layer can be formed through a simple method.

According to the method of manufacturing a magnetic transducer or the method of manufacturing a thin film magnetic head of another aspect of the invention, the crystal-growth inhibitor layer containing at least one element in a group consisting of Cu, Au, Ag and Rh is formed by use of vacuum deposition, so that the crystal-growth inhibitor layer can be formed through a simple method.

Obviously many modifications and variations of the present invention are possible in the light of the above teachings. It is therefore to be understood that within the scope of the appended claims the invention may be practiced otherwise than as specifically described.

What is claimed is:

1. A magnetic transducer comprising a stack including: a nonmagnetic layer having a pair of surfaces; a soft magnetic layer formed on one surface of the nonmagnetic layer; a ferromagnetic layer formed on the other surface of the nonmagnetic layer, the ferromagnetic layer having an inner ferromagnetic layer, a coupling layer and an outer ferromagnetic layer, which are stacked in this order on the nonmagnetic layer; and an antiferromagnetic layer formed on the ferromagnetic layer on the side opposite to the nonmagnetic layer, wherein an average crystal particle diameter of at least one of a surface, interfacing with the coupling layer, of the inner ferromagnetic layer and a surface, interfacing with the coupling layer, of the outer ferromagnetic layer is greater than or equal to 3 nm and less than 8 nm.

2. A magnetic transducer according to claim 1, wherein the stack includes a crystal-growth inhibitor layer, which is located at least one of on a side close to the antiferromagnetic layer and on a side close to the soft magnetic layer with respect to the coupling layer and is made of a material containing at least one element in a group consisting of oxygen (O), nitrogen (N), hydrogen (H), copper (Cu), gold (Au), silver (Ag) and rhodium (Rh).

3. A magnetic transducer according to claim 2, wherein the crystal-growth inhibitor layer is dispersedly formed in the direction perpendicular to the stacking direction of the stack.

4. A magnetic transducer according to claim 1, wherein the inner ferromagnetic layer and the outer ferromagnetic layer are made of a material containing at least cobalt in a group consisting of cobalt (Co) and iron (Fe).

5. A magnetic transducer according to claim 1, wherein the coupling layer is made of a material containing at least one element in a group consisting of ruthenium (Ru), rhodium, rhenium (Re) and chromium (Cr).

6. A magnetic transducer comprising a stack including: a nonmagnetic layer having a pair of surfaces; a soft magnetic layer formed on one surface of the nonmagnetic layer; a ferromagnetic layer formed on the other surface of the nonmagnetic layer, the ferromagnetic layer having an inner ferromagnetic layer, a coupling layer and an outer ferromagnetic layer, which are stacked in this order on the nonmagnetic layer; and an antiferromagnetic layer formed on the ferromagnetic layer on the side opposite to the nonmagnetic layer, wherein at least one of the inner ferromagnetic layer and the outer ferromagnetic layer has an average crystal particle diameter that is greater than or equal to 3 nm and less than 8 nm in a direction perpendicular to a stacking direction of the stack.

7. A magnetic transducer according to claim 6, wherein the stack includes a crystal-growth inhibitor layer, which is located at least one of on the side close to the antiferromagnetic layer and on the side close to the soft magnetic layer with respect to the coupling layer and is made of a material containing at least one element in a group consisting of oxygen (O), nitrogen (N), hydrogen (H), copper (Cu), gold (Au), silver (Ag) and rhodium (Rh).

8. A magnetic transducer according to claim 7, wherein the crystal-growth inhibitor layer is dispersedly formed in the direction perpendicular to the stacking direction of the stack.

9. A magnetic transducer according to claim 6, wherein the inner ferromagnetic layer and the outer ferromagnetic layer are made of a material containing at least cobalt in a group consisting of cobalt (Co) and iron (Fe).

10. A magnetic transducer according to claim 6, wherein the coupling layer is made of a material containing at least one element in a group consisting of ruthenium (Ru), rhodium, rhenium (Re) and chromium (Cr).

11. A thin film magnetic head comprising: a stack including a nonmagnetic layer having a pair of surfaces, a soft magnetic layer formed on one surface of the nonmagnetic layer, a ferromagnetic layer formed on the other surface of the nonmagnetic layer, and an antiferromagnetic layer formed on the ferromagnetic layer on the side opposite to the nonmagnetic layer; and a base for supporting the stack, wherein the ferromagnetic layer has an inner ferromagnetic layer, a coupling layer and an outer ferromagnetic layer, which are stacked in this order on the nonmagnetic layer, and an average crystal particle diameter of a surface or surfaces, interfacing with the coupling layer, of at least one of the inner ferromagnetic layer and the outer ferromagnetic layer, which is closer to the base, is greater than or equal to 3 nm and less than 8 nm.

12. A thin film magnetic head according to claim 11, wherein the stack includes a crystal-growth inhibitor layer, which is located on the side closer to the base with respect to the coupling layer and is made of a material containing at least one element in a group consisting of oxygen, nitrogen, hydrogen, copper, gold, silver and rhodium.

13. A thin film magnetic head according to claim 12, wherein the crystal-growth inhibitor layer is dispersedly formed in the direction perpendicular to the stacking direction of the stack.

14. A thin film magnetic head according to claim 11, wherein the inner ferromagnetic layer and the outer ferromagnetic layer are made of a material containing at least cobalt in a group consisting of cobalt and iron.

15. A thin film magnetic head according to claim 11, wherein the coupling layer is made of a material containing at least one element in a group consisting of ruthenium, rhodium, rhenium and chromium.

16. A thin film magnetic head comprising: a stack including a nonmagnetic layer having a pair of surfaces, a soft magnetic layer formed on one surface of the nonmagnetic layer, a ferromagnetic layer formed on the other surface of the nonmagnetic layer, and an antiferromagnetic layer formed on the ferromagnetic layer on the side opposite to the nonmagnetic layer; and a base for supporting the stack, wherein the ferromagnetic layer has an inner ferromagnetic layer, a coupling layer and an outer ferromagnetic layer, which are stacked in this order on the nonmagnetic layer, and at least one of the inner ferromagnetic layer and the outer ferromagnetic layer, which is located closer to the base, has an average crystal particle diameter that is greater than or equal to 3 nm and less than 8 nm in a direction perpendicular to a stacking direction of the stack.

17. A thin film magnetic head according to claim 16, wherein the stack includes a crystal-growth inhibitor layer, which is located on the side closer to the base with respect to the coupling layer and is made of a material containing at least one element in a group consisting of oxygen, nitrogen, hydrogen, copper, gold, silver and rhodium.

18. A thin film magnetic head according to claim 17, wherein the crystal-growth inhibitor layer is dispersedly formed in the direction perpendicular to the stacking direction of the stack.

19. A thin film magnetic head according to claim 16, wherein the inner ferromagnetic layer and the outer ferromagnetic layer are made of a material containing at least cobalt in a group consisting of cobalt and iron.

20. A thin film magnetic head according to claim 16, wherein the coupling layer is made of a material containing at least one element in a group consisting of ruthenium, rhodium, rhenium and chromium.

21. A magnetic transducer comprising a stack including: a nonmagnetic layer having a pair of surfaces; a soft magnetic layer formed on one surface of the nonmagnetic layer; a ferromagnetic layer formed on the other surface of the nonmagnetic layer, the ferromagnetic layer having an inner ferromagnetic layer, a coupling layer and an outer ferromagnetic layer, which are stacked in this order on the nonmagnetic layer; and an antiferromagnetic layer formed on the ferromagnetic layer on the side opposite to the nonmagnetic layer, wherein the stack includes a crystal-growth inhibitor layer, which is located on at least one of a side close to the antiferromagnetic layer and a side close to the soft magnetic layer with respect to the coupling layer, the crystal-growth inhibitor layer being dispersedly formed in the direction perpendicular to the stacking direction of the stack.

22. A thin film magnetic head comprising: a stack including a nonmagnetic layer having a pair of surfaces, a soft magnetic layer formed on one surface of the nonmagnetic layer, a ferromagnetic layer formed on the other surface of the nonmagnetic layer, and an antiferromagnetic layer formed on the ferromagnetic layer on the side opposite to the nonmagnetic layer; and a base for supporting the stack, wherein the ferromagnetic layer has an inner ferromagnetic layer, a coupling layer and an outer ferromagnetic layer, which are stacked in this order on the nonmagnetic layer, and the stack includes a crystal-growth inhibitor layer, which is located on at least one of a side close to the antiferromagnetic layer and a side close to the soft magnetic layer with respect to the coupling layer, the crystal-growth inhibitor layer being dispersedly formed in the direction perpendicular to the stacking direction of the stack.

* * * * *